(12) United States Patent
Bunyk et al.

(10) Patent No.: US 9,710,758 B2
(45) Date of Patent: Jul. 18, 2017

(54) QUANTUM PROCESSOR WITH INSTANCE PROGRAMMABLE QUBIT CONNECTIVITY

(71) Applicant: D-Wave Systems Inc., Burnaby (CA)

(72) Inventors: Paul I. Bunyk, Vancouver (CA);
Mohammad H. S. Amin, Burnaby (CA); Richard G. Harris, North Vancouver (CA); Trevor Michael Lanting, Vancouver (CA); Mark W. Johnson, Vancouver (CA); Jeremy P. Hilton, Burnaby (CA); Emile M. Hoskinson, Vancouver (CA)

(73) Assignee: D-Wave Systems Inc., Burnaby (CA)

( * ) Notice: Subject to any disclaimer, the term of this patent is extended or adjusted under 35 U.S.C. 154(b) by 273 days.

(21) Appl. No.: 14/691,268

(22) Filed: Apr. 20, 2015

(65) Prior Publication Data

US 2016/0335558 A1    Nov. 17, 2016

Related U.S. Application Data

(60) Provisional application No. 61/983,370, filed on Apr. 23, 2014.

(51) Int. Cl.
*G06F 15/82*    (2006.01)
*G06N 99/00*    (2010.01)

(52) U.S. Cl.
CPC .......... *G06N 99/002* (2013.01); *G06F 15/82* (2013.01)

(58) Field of Classification Search
None
See application file for complete search history.

(56) References Cited

U.S. PATENT DOCUMENTS 7,135,701 B2   11/2006   Amin et al.
7,418,283 B2    8/2008   Amin
(Continued)

FOREIGN PATENT DOCUMENTS

WO    2012/064974 A2    5/2012

OTHER PUBLICATIONS

Bocko et al., "Prospects for Quantum Coherent Computation Using Superconducting Electronics," *IEEE Transactions on Applied Superconductivity* 7(2):3638-3641, Jun. 1997.
(Continued)

*Primary Examiner* — Eric Coleman
(74) *Attorney, Agent, or Firm* — Seed IP Law Group LLP

(57) ABSTRACT

In a quantum processor some couplers couple a given qubit to a nearest neighbor qubit (e.g., vertically and horizontally in an ordered 2D array), other couplers couple to next-nearest neighbor qubits (e.g., diagonally in the ordered 2D array). Couplers may include half-couplers, to selectively provide communicative coupling between a given qubit and other qubits, which may or may not be nearest or even next-nearest-neighbors. Tunable couplers selective mediate communicative coupling. A control system may impose a connectivity on a quantum processor, different than an "as designed" or "as manufactured" physical connectivity. Imposition may be via a digital processor processing a working or updated working graph, to map or embed a problem graph. A set of exclude qubits may be created from a comparison of hardware and working graphs. An annealing schedule may adjust a respective normalized inductance of one or more qubits, for instance to exclude certain qubits.

28 Claims, 16 Drawing Sheets

(56) References Cited

U.S. PATENT DOCUMENTS

| | | | |
|---|---|---|---|
| 7,533,068 | B2 | 5/2009 | Maassen van den Brink et al. |
| 7,619,437 | B2 * | 11/2009 | Thom ............... B82Y 10/00 257/30 |
| 7,639,035 | B2 | 12/2009 | Berkley |
| 7,800,395 | B2 * | 9/2010 | Johnson ............ B82Y 10/00 326/1 |
| 7,843,209 | B2 | 11/2010 | Berkley |
| 7,876,248 | B2 | 1/2011 | Berkley et al. |
| 7,984,012 | B2 | 7/2011 | Coury et al. |
| 8,008,942 | B2 | 8/2011 | van den Brink et al. |
| 8,018,244 | B2 | 9/2011 | Berkley |
| 8,035,540 | B2 | 10/2011 | Berkley et al. |
| 8,063,657 | B2 * | 11/2011 | Rose ............... B82Y 10/00 326/101 |
| 8,098,179 | B2 | 1/2012 | Bunyk et al. |
| 8,169,231 | B2 * | 5/2012 | Berkley ............ B82Y 10/00 326/1 |
| 8,174,305 | B2 | 5/2012 | Harris |
| 8,190,548 | B2 | 5/2012 | Choi |
| 8,195,596 | B2 | 6/2012 | Rose et al. |
| 8,421,053 | B2 | 4/2013 | Bunyk et al. |
| 8,786,476 | B2 | 7/2014 | Bunyk et al. |
| 8,854,074 | B2 | 10/2014 | Berkley |
| 2003/0207766 | A1 * | 11/2003 | Esteve ............. B82Y 10/00 505/190 |
| 2010/0148853 | A1 * | 6/2010 | Harris ............. G06N 99/002 327/528 |
| 2011/0060780 | A1 | 3/2011 | Berkley et al. |
| 2014/0097405 | A1 | 4/2014 | Bunyk |
| 2015/0032993 | A1 | 1/2015 | Amin et al. |

OTHER PUBLICATIONS

Bunyk, "Quantum Processor With Instance Programmable Qubit Connectivity," U.S. Appl. No. 61/983,370, filed Apr. 23, 2014, 53 pages.

Clarke et al., "Superconducting quantum bits," *Nature* 453:1031-1042, Jun. 19, 2008.

Coury, "Embedding Graphs into the Extended Grid," arXiv:0703001v1, Feb. 28, 2007, 4 pages.

Devoret et al., "Superconducting Circuits for Quantum Information: An Outlook," *Science* 339:1169-1174, Mar. 8, 2013.

Devoret et al., "Superconducting Qubits: A Short Review," arXiv:cond-mat/0411174v1, Nov. 7, 2004, 41 pages.

Friedman et al., "Quantum superposition of distinct macroscopic states," *Nature* 406:43-46, Jul. 6, 2000.

Harris et al., "Experimental Investigation of an Eight-Qubit Unit Cell in a Superconducting Optimization Processor," arXiv:1004.1628v2, Jun. 28, 2010, 16 pages.

Makhlin et al., "Quantum-state engineering with Josephson-junction devices," *Reviews of Modern Physics* 73(2):357-400, Apr. 2001.

Martinis, "Superconducting phase qubits," *Quantum Inf Process* 8:81-103, 2009.

Mooij et al., "Josephson Persistent-Current Qubit," *Science* 285:1036-1039, Aug. 13, 1999.

Orlando et al., "Superconducting persistent-current qubit," *Physical Review B* 60(22):15398-15413, Dec. 1, 1999.

Zagoskin et al., "Superconducting Qubits," *La Physique au Canada* 63(4):215-227, 2007.

* cited by examiner

QUANTUM PROCESSOR WITH INSTANCE PROGRAMMABLE QUBIT CONNECTIVITY

BACKGROUND

Field

This disclosure generally relates to designs, layouts, and architectures for quantum processors comprising qubits.

Quantum Devices

Quantum devices are structures in which quantum mechanical effects are observable. Quantum devices include circuits in which current transport is dominated by quantum mechanical effects. Such devices include spintronics, where electronic spin is used as a resource, and superconducting circuits. Both spin and superconductivity are quantum mechanical phenomena. Quantum devices can be used for measurement instruments, in computing machinery, and the like.

Quantum Computation

Quantum computation and quantum information processing are active areas of research and define classes of vendible products. A quantum computer is a system that makes direct use of at least one quantum-mechanical phenomenon, such as, superposition, tunneling, and entanglement, to perform operations on data. The elements of a quantum computer are not binary digits (bits) but typically are quantum binary digits or qubits. Quantum computers hold the promise of providing exponential speedup for certain classes of computation problems like simulating quantum physics. Useful speedup may exist for other classes of problems.

There are several types of quantum computers. An early proposal from Feynman in 1981 included creating artificial lattices of spins. More complicated proposals followed including a quantum circuit model where logical gates are applied to qubits in a time ordered way. In 2000, a model of computing was introduced for solving satisfiability problems; based on the adiabatic theorem this model is called adiabatic quantum computing. This model is believed useful for solving hard optimization problems and potentially other problems.

Adiabatic Quantum Computation

Adiabatic quantum computation typically involves evolving a system from a known initial Hamiltonian (the Hamiltonian being an operator whose eigenvalues are the allowed energies of the system) to a final Hamiltonian by gradually changing the Hamiltonian. A simple example of an adiabatic evolution is a linear interpolation between initial Hamiltonian and final Hamiltonian. An example is given by:

$$H_e = (1-s)H_i + sH_f \quad (1)$$

where $H_i$ is the initial Hamiltonian, $H_f$ is the final Hamiltonian, $H_e$ is the evolution or instantaneous Hamiltonian, and s is an evolution coefficient which controls the rate of evolution. As the system evolves, the evolution coefficient s goes from 0 to 1 such that at the beginning (i.e., s=0) the evolution Hamiltonian $H_e$ is equal to the initial Hamiltonian $H_i$ and at the end (i.e., s=1) the evolution Hamiltonian $H_e$ is equal to the final Hamiltonian $H_f$. Before the evolution begins, the system is typically initialized in a ground state of the initial Hamiltonian $H_i$ and the goal is to evolve the system in such a way that the system ends up in a ground state of the final Hamiltonian $H_f$ at the end of the evolution. If the evolution is too fast, then the system can transition to a higher energy state, such as the first excited state. In the present systems and devices, an "adiabatic" evolution is an evolution that satisfies the adiabatic condition:

$$\dot{s} | \langle 1 | dH_e/ds | 0 \rangle | = \delta g^2(s) \quad (2)$$

where $\dot{s}$ is the time derivative of s, g(s) is the difference in energy between the ground state and first excited state of the system (also referred to herein as the "gap size") as a function of s, and δ is a coefficient much less than 1. Generally the initial Hamiltonian $H_i$ and the final Hamiltonian $H_f$ do not commute. That is, $[H_i, H_f] \neq 0$.

The process of changing the Hamiltonian in adiabatic quantum computing may be referred to as evolution. If the rate of change, for example, change of s, is slow enough that the system is always in the instantaneous ground state of the evolution Hamiltonian then transitions at anti-crossings (i.e., when the gap size is smallest) are avoided. The example of a linear evolution schedule is given above. Other evolution schedules are possible including non-linear, parametric, and the like. Further details on adiabatic quantum computing systems, methods, and apparatus are described in, for example, U.S. Pat. Nos. 7,135,701; and 7,418,283.

Quantum Annealing

Quantum annealing is a computation method that may be used to find a low-energy state, typically preferably the ground state, of a system. Similar in concept to classical simulated annealing, the method relies on the underlying principle that natural systems tend towards lower energy states because lower energy states are more stable. However, while classical annealing uses classical thermal fluctuations to guide a system to a low-energy state and ideally its global energy minimum, quantum annealing may use quantum effects, such as quantum tunneling, as a source of delocalization, sometimes called disordering, to reach a global energy minimum more accurately and/or more quickly than classical annealing. In quantum annealing thermal effects and other noise may be present. The final low-energy state may not be the global energy minimum.

Adiabatic quantum computation may be considered a special case of quantum annealing for which the system, ideally, begins and remains in its ground state throughout an adiabatic evolution. Thus, those of skill in the art will appreciate that quantum annealing systems and methods may generally be implemented on an adiabatic quantum computer. Throughout this specification and the appended claims, any reference to quantum annealing is intended to encompass adiabatic quantum computation unless the context requires otherwise.

Quantum annealing uses quantum mechanics as a source of delocalization during the annealing process. The optimization problem is encoded in a Hamiltonian $H_P$, and the algorithm introduces quantum effects by adding a delocalization Hamiltonian $H_D$ that does not commute with $H_P$. An example case is:

$$H_E \propto A(t)H_D + B(t)H_P \quad (3)$$

where A(t) and B(t) are time dependent envelope functions. For example, A(t) changes from a large value to substantially zero during the evolution. The Hamiltonian $H_E$ may be thought of as an evolution Hamiltonian similar to $H_e$ described in the context of adiabatic quantum computation above. The delocalization may be removed by removing $H_D$ (i.e., reducing A(1)). Thus, quantum annealing is similar to adiabatic quantum computation in that the system starts with an initial Hamiltonian and evolves through an evolution Hamiltonian to a final "problem" Hamiltonian $H_P$ whose ground state encodes a solution to the problem. If the evolution is slow enough, the system may settle in the global minimum (i.e., the exact solution), or in a local minimum close in energy to the exact solution. The performance of the computation may be assessed via the residual energy (difference from exact solution using the objective function) versus evolution time. The computation time is the time required to generate a residual energy below some acceptable threshold value. In quantum annealing, Hp may encode an optimization problem and therefore $H_P$ may be diagonal in the subspace of the qubits that encode the solution, but the system does not necessarily stay in the ground state at all times. The energy landscape of Hp may be crafted so that its global minimum is the answer to the problem to be solved, and low-lying local minima are good approximations.

Superconducting Qubits There are solid state qubits based on circuits of superconducting materials. Superconducting material conducts without electrical resistance under certain conditions like below a critical temperature, a critical current, or a magnetic field strength, or for some materials above a certain pressure. There are two superconducting effects that underlie how superconducting qubits operate: magnetic flux quantization, and Josephson tunneling.

Flux is quantized via the Aharonov-Bohm effect where electrical charge carriers accrue a topological phase when traversing a conductive loop threaded by a magnetic flux. For superconducting loops, the charge carries are pairs of electrons called Cooper pairs. For a loop of sufficiently thick superconducting material quantum mechanics dictates that the Cooper pairs accrue a phase that is an integer multiple of $2\pi$. This then constrains the allowed flux in the loop. The current in the loop is governed by a single wavefunction and, for the wavefunction to be single-valued at any point in the loop. The flux within is quantized. In other words, superconductivity is not simply the absence of electrical resistance but rather a quantum mechanical effect. Flux quantization has more general condition fluxoid quantization. The fluxoid in a loop of superconducting material differs from the flux by a line integral of the supercurrent around the loop.

Josephson tunneling is the process by which Cooper pairs cross an interruption, such as an insulating gap of a few nanometres, between two superconducting electrodes. The amount of current is sinusoidally dependent on the phase difference between the two populations of Cooper pairs in the electrodes. That is, the phase difference across the interruption.

These superconducting effects are present in different configurations and give rise to different types of superconducting qubits including flux, phase, charge, and hybrid qubits. These different types of qubits depend on the topology of the loops, placement of the Josephson junctions, and the physical parameters of the parts of the circuits, such as, inductance, capacitance, and Josephson junction critical current.

Quantum Processor

A plurality of superconducting qubits may be included in a superconducting quantum processor. A superconducting quantum processor may include a number of qubits and associated local bias devices, for instance two or more superconducting qubits. A superconducting quantum processor may also employ couplers (i.e., "coupling device structures") providing communicative coupling between qubits. A qubit and a coupler resemble each other but differ in physical parameters. One difference is the parameter, $\beta$. Consider an rf-SQUID, superconducting loop interrupted by Josephson junction, $\beta$ is the ratio of the inductance of the Josephson junction to the geometrical inductance of the loop. A design with lower values of $\beta$, about 1, behaves more like a simple inductive loop, a monostable device. A design with higher values is more dominated by the Josephson junctions, and is more likely to have bistable behavior. The parameter, $\beta$ is defined a $2\pi L I_C/\Phi_0$, and can be called normalized inductance. That is, $\beta$ is proportional to the product of inductance and critical current. One can vary the inductance, for example, a qubit is normally larger than its associated coupler. The larger device has a larger inductance and thus the qubit is often a bistable device and a coupler monostable. Alternatively the critical current can be varied, or the product of the critical current and inductance can be varied. A qubit often will have more devices associated with it. Further details and implementations of exemplary quantum processors that may be used in conjunction with the present systems and devices are described in, for example, U.S. Pat. Nos. 7,533,068; 8,008,942; 8,195,596; 8,190,548; and 8,421,053.

The types of problems that may be solved by any particular embodiment of a quantum processor, as well as the relative size and complexity of such problems, typically depend on many factors. Two such factors may include the number of qubits in the quantum processor and the number of possible communicative connections between qubits in the quantum processor.

U.S. Pat. No. 8,421,053 describes a quantum processor with qubits laid out into an architecture of unit cells including bipartite graphs, such as, $K_{4,4}$. In such an example, each qubit may communicatively couple to at least four other qubits. Some qubits in the architecture may have a physical connectivity of six. Depending on the available number of qubits and their interaction, problems of various sizes may be embedded into the quantum processor.

Graphs and Embedding

Some optimization problems may be defined on a graph, referred to as a problem graph. The problem graph specifies a set of variables and couplings between some of these variables depending on the problem. In essence the variables and couplings are a set of nodes and edges of an undirected graph. A quantum processor also can also be described as a graph, referred to as a processor or hardware graph. In the processor or hardware graph there are representations of a plurality of qubits and some of the qubits are directly communicatively coupleable to one another via couplers, without intervening qubits. Mapping of the problem graph to the processor or hardware graph is known as embedding. In embedding a variable from the problem graph into the processor or hardware graph, the variable may span two or more physical qubits, collectively referred to in such an implementation as a logical qubit. Further details and implementations of exemplary embeddings that may be used in conjunction with the present systems and devices are described in U.S. Pat. No. 7,984,012 and Coury, 2007, arXiv:cs/0703001.

BRIEF SUMMARY

Applicant has previously employed the term "connectivity" to describe the number of possible or available communicative coupling paths that are physically available (e.g., whether active or not) to communicably couple directly between pairs of qubits in a quantum processor without the use of intervening qubits. Applicant introduces new terminology to distinguish between various measures of connectivity. For example, Applicant introduces terminology to distinguish between various forms of physically available connectivity (e.g., "as designed physical connectivity"; "as manufactured physical connectivity"). Applicant also introduces terminology to distinguish programmed or logical connectivity (e.g., imposed connectivity). Applicant further introduces terminology to distinguish between quantum processor wide connectivity (e.g., processor-wide minimal connectivity), and more specific subsets of the quantum processor (inner minimal connectivity). As an example, a qubit with a physical connectivity of three is physically capable of directly communicably coupling to up to three other qubits without any intervening qubits due to the physical architecture of the qubits and couplers as manufactured. In other words, there are direct communicative coupling paths available to a maximum of three other qubits, although in any particular application all or less than all of those direct communicative coupling paths may actually be employed depending on the particular problem being solved and/or mapping of that particular problem to the processor or hardware. Typically, the number of qubits in a quantum processor limits the size of problems that may be solved and the interaction between the qubits in a quantum processor limits the complexity of the problems that may be solved.

The following discussion of various stages and associated quantum processor characteristics provides a basis for understanding the more detailed discussion of the present methods, systems and devices which follow, including introducing more specific terminology for various measures of quantum processor characteristics such as various measures of connectivity.

In general, the lifecycle of a quantum processor may be broken to a number of distinct segments or stages. For example, initial segments or stages may include those during which the quantum processor is designed and fabricated or otherwise manufactured, and a subsequent segments or stages may include those during which the quantum processor is prepared and used. Distinct segments or stages may, for instance include one or more of: 1) design; 2) manufacture; 3) calibration; 4) configuration; 5) embedding; 6) programming; 7) annealing; 8) readout; and/or 9) return, where any of stages 3-9 are repeated multiple times over the life cycle.

The operational characteristics of any given quantum processor may vary at various stages. For example, actual physical or "as manufactured" characteristics may vary from the designed characteristics. Also for example, logical or programmed or configured constraints may be placed on the characteristics of a quantum processor, which differ or vary from the actual physical or "as manufactured" characteristics. A discussion of exemplary stages follows, but such is not intended to be limiting. For example, some implementations may omit one or more stages, add one or more stages, or possibly arrange the stages in a different order than presented below. Further, the specifics of one or more stages may, in some instance, differ from that described below.

1) Design Stage

Initially, a quantum processor is designed or laid out. This includes laying out an architecture or topology of qubits and couplers. As noted above, couplers are selectively operable to communicatively couple pairs of qubits. The architecture or topology typically lays out the qubits in a two-dimensional array on a substrate. The qubits may be arrayed, for example in alignment with one another in rows and columns. Alternatively, qubits may be arranged staggered with respect to one another, for example with the qubits in each successive column shifted along the column with respect to corresponding qubits in adjacent or neighboring columns.

In one form of architecture or topology, there is a respective coupler arranged between each pair of nearest neighbor qubits. Thus, for a given qubit in an interior of a two-dimensional array of qubits arranged in aligned rows and columns, there may be, for example, four couplers which selectively provide communicative coupling to four nearest neighbor qubits. Those nearest neighbors may, for instance include two qubits which each reside on either side of the row in which the given qubit resides, and two qubits which each reside on either side of the given qubit in a column in which the given qubit resides.

In one form of architecture or topology, there is additionally or alternatively a respective coupler arranged between each pair of next-nearest neighbor qubits. Thus, for a given qubit in an interior of two-dimensional array of qubits arranged in rows and columns, there may be, for example, four couplers which selectively provide communicative coupling to four next-nearest neighbors. Those next-nearest neighbors may reside on either side of the given qubit on a diagonal that passes through the given qubit. For instance, the next-nearest neighbor qubits may be arranged, one row up and one row left of the given qubit, one row up and one row right of the given qubit, one row below and one row left of the given qubit, and one row below and one row right of the given qubit.

In one form of architecture or topology, structures denominated herein as "half-couplers" selectively allow communicative coupling between a given qubit and selective ones of two or more other qubits, which may or may not be nearest or even next-nearest-neighbors. Half-couplers are discussed in detail elsewhere herein.

For each architecture or topology design there is a design processor or hardware graph that represents the architecture or topology design. The design processor or hardware graph is a logical construct, stored in a nontransitory computer- or processor-readable medium, that is a representation of a theoretical or "designed" architecture or topology of the quantum processor. The design processor or hardware graph may, for instance, be employed by a programming or mapping system (e.g., digital processor, associated nontransitory computer- or processor-readable media, qubit control system, coupler control system) in configuring the quantum processor for operation.

For each architecture or topology design there are one or more values that are measures of a theoretical or "designed" physical connectiveness characteristics of the qubits of the quantum processor. This designed physical connectiveness may be expressed in terms of various measures of a designed physical connectivity of the processor design. For example, designed physical connectiveness may be expressed in terms of a designed processor-wide minimal physical connectivity measure or value, that is a maximum number of direct qubit to qubit (i.e., without intervening qubits) connections physically available for a qubit with the smallest number of physically available direct connections per the processor design, whether those direct connections are ever used or not in solving any particular problem.

Typically, qubits on an outer perimeter (i.e., qubits positioned along the edges of the array) of the architecture or topology layout will have a smaller number of physically available direct connections than qubits located inwardly of the perimeter. The qubits on an outer perimeter of the array are denominated herein as perimeter, or edge, qubits. Where the qubits are arrayed in an array with a polygonal perimeter (e.g., square, rectangular, hexagonal), the qubits at the corners of the perimeter typically have the smallest number of physically available direct connections. These qubits at the corners of the perimeter are denominated herein as corner qubits. Thus, the edge or corner qubits may limit the measure of physical connectiveness for any given architecture or topology.

Many problems can be mapped to the quantum processor in a way that avoids the perimeter or edge qubits and/or avoids corner qubits, or in a way that otherwise limits any possible negative consequences (e.g., low physical connectiveness) of using perimeter or edge qubits or corner qubits in problem solving. Consequently, it may be useful to represent designed physical connectiveness in terms of a designed inner minimal connectivity, that is a maximum number of direct connections physically available for the non-perimeter or non-edge qubit with the smallest number of physically available direct connections of the set of non-perimeter or non-edge qubits. These non-perimeter or non-edge qubits are referred to herein as inner qubits, per the processor design, whether those direct connections are ever used or not in solving any particular problem.

There may be instances where it is helpful to consider physical connectedness in other terms. For instance, it may be useful to represent designed physical connectiveness in terms of a designed processor-wide modal physical connectivity, which is the modal value of the number of possible or available direct physical connections for the qubits of the quantum processor per the design. The term processor-wide means all qubits in the quantum processor, including edge, corner and inner qubits. Also for instance, it may be useful to represent physical connectiveness in terms of a designed processor-wide mean physical connectivity, which is the mean value of the number of possible or available direct physical connectors for the qubits of the quantum processor per the design. Also for instance, it may be useful to represent physical connectiveness in terms of a designed processor-wide median physical connectivity, which is the median value of the number of possible or available direct physical connectors for the qubits of the quantum processor per the design.

2) Manufacture Stage

One or more quantum processors are fabricated or manufactured according to a given design. However, in some instances, one or more defects may prevent all of the qubits and/or all of the couplers of any given manufactured quantum processor from being operational or within tolerance of a design specification (i.e., within spec). Thus, the design processor or hardware graph for the design may not be an accurate portrayal of any given instance of the manufactured quantum processor. In fact, different instances of the quantum processors based on a given design may vary from one another due to these manufacturing defects or out of tolerance components. This may lead to the need or desire to accommodate for such differences, for example by specifying a working processor or hardware graph, as discussed below.

The actual or "as manufactured" physical characteristics may be inherent in the resulting physical structure of the quantum processor as manufactured. Yet, one or more acts may be necessary in order to determine the existence of defects or out of specification components, and/or quantify the actual or "as manufactured" physical characteristics. For example, one or more calibrations (discussed below) may be performed to determine the actual or "as manufactured" physical characteristics of a given actual or as manufactured quantum processor.

For each manufactured quantum processor there are one or more actual physical or "as manufactured" characteristics that are measures of an actual or "as manufactured" physical connectiveness of the qubits of the quantum processor. This physical connectiveness may be expressed in terms of various measures of a physical connectivity of the processor. For example, actual or "as manufactured" physical connectiveness may be expressed in terms of an actual, as manufactured or physical processor-wide minimal connectivity, that is a maximum number of direct connections physically available for the qubit with the smallest number of physically available direct connections per the actual or manufactured quantum processor, whether those direct connections are ever used or not in solving any particular problem.

As previously noted, it may be desirable to account for perimeter or edge qubits which typically have the smallest number of physically available direct connections. Consequently, it may be useful to represent actual, "as manufactured" or physical connectiveness in terms of an actual, "as manufactured" or physical inner minimal connectivity, that is a maximum number of direct connections physically available for the non-perimeter or non-edge qubit with the smallest number of physically available direct connections of the set of non-perimeter or non-edge qubits (i.e., inner qubits) per the actual or "as manufactured" quantum processor, whether those direct connections are ever used or not in solving any particular problem.

There may be instances where it is helpful to consider actual or "as manufactured" physical connectedness in other terms. For instance, it may be useful to represent actual or "as manufactured" physical connectiveness in terms of an actual or "as manufactured" processor-wide modal physical connectivity, which is the modal value of the number of possible or available direct physical connections for the qubits of the quantum processor "as manufactured." Also for instance, it may be useful to represent physical connectiveness in terms of an actual or "as manufactured" processor-wide mean physical connectivity, which is the mean value of the number of possible or available direct physical connectors for the qubits of the quantum processor as manufactured. Also for instance, it may be useful to represent physical connectiveness in terms of an actual or "as manufactured" processor-wide median physical connectivity, which is the median value of the number of possible or available direct physical connectors for the qubits of the quantum processor "as manufactured."

3) Calibration Stage

Calibration determines if the components (e.g., qubits, couplers) of the actual or as manufactured quantum processor are operational (e.g., within tolerances of operational specifications. Such may include testing of various components (e.g., qubits, connectors) to determine whether such function within operational specifications. It may be useful to generate a working processor or hardware graph which omits components which are not operational or which are out of operational specification. The working processor or hardware graph is a logical construct, stored in a nontransitory computer- or processor-readable medium, which is a representation of the actual or "as manufactured" physical topology or architecture of the processor accounting for manufacturing or fabrication defects or otherwise out of specification components. The working processor or hardware graph may, for instance, be generated based on the design processor or hardware graph. Where all components are operational or within tolerances of operational specifications, the working processor or hardware graph may be identical to the design processor or hardware graph. Otherwise, the working hardware graph may be a subset of the design processor or hardware graph, excluding components that are deemed not operational, and possibly neighboring components which are adversely affected by the non-operational or out of specification component(s) (e.g., excluding a coupler between a pair of qubits where one of the qubits is not operational). The working processor or hardware graph may facilitate a mapping of a problem, represented for instance by a problem graph, onto or into the actual operational structure of the quantum processor via a mapping or embedding system.

Consistent with the above description, the concept of physical connectivity has to do with characterization of the physically possible or physically available direct communicative connections between pairs of qubits. Notably, this usage is independent of any logical constraints and/or particular problem mapping. The measure of physical connectivity of the quantum processor at this stage and subsequent stages is the same as that at the manufacturing stage, discussion of which will not be repeated here in the interest of brevity. As described below, Applicant introduces the concept of imposed connectivity, which is a logical construct which imposes a connectivity on the use of the quantum processor. The logical construct may be imposed via a programming, mapping or embedding system, for instance, by limiting one or more components (e.g., qubits, couplers) made to map or embed a problem into or on the quantum processor. The problem may, for example be represented by a corresponding problem graph, while the available components may be represented via a working processor or hardware graph or updated working processor or hardware graph. As noted below, any particular measure of imposed connectivity may be equal to or less than the corresponding measure of the physical connectivity for a given quantum processor.

4) Configuration Stage

Configuration is an optional stage. Some implementations may omit the configuration stage. Configuration may, for example, be unique to quantum processors with field programmable connectivities. Configuration may result in a first subset of the components being made available for embedding, while a second subset of the components is placed off limits, for example being reserved for some other use.

As discussed above, the physically available components may, for example, be represented as a working processor or hardware graph.

Configuration may generate or result in an updated working processor or hardware graph, to facilitate a mapping of problems represented by problem graphs onto the configured representation of the quantum processor. The updated working processor or hardware graph is a logical construct, stored in a nontransitory computer- or processor-readable medium, which is a representation of the actual or "as manufactured" physical topology or architecture of the processor, accounting for manufacturing or fabrication defects and for configuration, with imposed or logical constraints placed thereupon. The updated working processor or hardware graph may be generated based on the design working graph. Typically, the updated working processor or hardware graph will be a subset of the working processor or hardware graph, further excluding components and/or communicative paths that are logically placed off limits or logically reserved for other uses, even though those components and/or communicative paths being placed off limits or logically reserved are physically available and functional.

As noted above, logical constraints, such as those imposed via configuration and the updated working processor or hardware graph, do not affect the various measures of physical connectivity which are by definition independent of any logical constraints or particular problem mapping. Hence, the term imposed connectivity is used to indicate logical constraints imposed on connectivity. Notable, as used herein the term "imposed" refers to logical constraints which are imposed on the availability of components and/or communicative paths for use in mapping or embedding a problem, for example via use of an updated working processor or hardware graph. For instance, the updated working processor or hardware graph may provide a subset of the components and/or communicative paths into which to map a problem, for instance via one or more digital processors and embedding systems. Thus, the term "imposed connectivity" does not encompass measures of connectivity due to the mapping or embedding of particular problems onto or into the quantum processor. It is noted that, as a practical matter, one a particular problem is embedded into a quantum processor, at least the portion of the quantum processor made available via the working processor or hardware graph and/or the updated working processor or hardware graph may have a connectivity that matches the imposed connectivity due to the programming of the quantum processor which is part of the embedding process.

5) Embedding Stage

Embedding is configuring of the quantum processor to solve a defined problem, also referred to as mapping of the problem or problem graph to the working processor or hardware graph or updated working processor or hardware graph. The problem graph is a logical construct, stored in nontransitory computer- or processor-readable medium, which is a representation of a problem to be solved. The problem graph may be mapped or embedded via a mapping or embedding system.

As noted above, logical constraints, such as those imposed via embedding, do not affect the various measures of physical connectivity which are by definition independent of any logical constraints or particular problem mapping. Also as noted above, the embedding or mapping of a particular problem does not affect the measure of imposed connectivity, as the embedding occurs subsequent to the imposition of imposed connectivity via the working or the updated working processor or hardware graph.

6) Programming Stage

Programming is establishing the quantum processor to an initial state, also referred to as establishing an evolution Hamiltonian on a quantum processor. It is from this initial state a quantum processor is evolved in accordance with quantum annealing and/or adiabatic quantum computing.

Programming can include setting values within on-chip control circuitry on a processor. Establishing the quantum processor to an initial state does not affect the measure of imposed connectivity working graph, updated working graph, or hardware graph.

7) Annealing Stage

As described herein, annealing is a process of evolving the quantum processor to a certain state according to certain conditions. Annealing is described in detail elsewhere herein, so discussion of such is not repeated here in the interest of brevity.

As noted above, logical constraints, such as those imposed via embedding, do not affect the various measures of physical connectivity which are by definition independent of any logical constraints or particular problem mapping. Also as noted above, the embedding or mapping of a particular problem does not affect the measure of imposed connectivity, as the embedding occurs subsequent to the imposition of imposed connectivity via the working or the updated working processor or hardware graph.

8) Read Out Stage

Reading out is a stage in which the results of evolution are read out of the quantum processor. The results typically constitute one answer to the particular problem. In use, the results of multiple iterations of evolution may be evaluated to determine the best result(s). Reading out is described in detail elsewhere herein, so discussion of such is not repeated here in the interest of brevity.

As noted above, logical constraints, such as those imposed via embedding, do not affect the various measures of physical connectivity which are by definition independent of any logical constraints or particular problem mapping. Also as noted above, the embedding or mapping of a particular problem does not affect the measure of imposed connectivity, as the embedding occurs subsequent to the imposition of imposed connectivity via the working or the updated working processor or hardware graph.

9) Return Stage

The return stage is where the result(s) (e.g., values of the variables in the problem graph) are as returned to a user. The results may sometimes be returned to the user without embedding information, details of the working processor or hardware graph, updated working processor or hardware graph, etc.

As noted above, logical constraints, such as those imposed via embedding, do not affect the various measures of physical connectivity which are by definition independent of any logical constraints or particular problem mapping. Also as noted above, the embedding or mapping of a particular problem does not affect the measure of imposed connectivity, as the embedding occurs subsequent to the imposition of imposed connectivity via the working or the updated working processor or hardware graph.

It is noted that the embedding, annealing read out and/or return stages may be collectively referred to as runtime since those stages are related to runtime solution of individual problems. In contrast, the design, manufacturing, calibration and/or configuration stages may be referred to as pre-run time, essentially constituting operations or stages that occur independently of solving any particular problem. It is further noted that since a given quantum processor may go through many cycles of calibration and/or configuration, as well as many cycles of runtime operations, the term pre-run time refers to a period preceding a given most temporally successive runtime.

A quantum processor may be summarized as including: a first superconducting flux qubit including a first coupling portion and a first switch in parallel with the first coupling portion of the first superconducting flux qubit; a second superconducting flux qubit including a second coupling portion and a second switch in parallel with the second coupling portion of the second superconducting flux qubit; a coupler including: a first coupling portion; a second coupling portion; a third switch in parallel with the first coupling portion of the coupler, and the first coupling portion of the coupler is arranged with respect to the first coupling portion of the first superconducting flux qubit to effect a magnetic coupling between the first superconducting flux qubit and the coupler, a fourth switch in parallel with the second coupling portion of the coupler, and the second coupling portion of the coupler is arranged with respect to the second coupling portion of the second superconducting flux qubit to effect a magnetic coupling between the second superconducting flux qubit and the coupler; and a first interface to control the first switch, the second switch, the third switch, and the fourth switch to couple the first superconducting flux qubit with the second superconducting flux qubit via the coupler.

The inductance of the coupler may be less than the inductance of the first superconducting flux qubit. The coupler may be monostable, the first superconducting flux qubit may be bistable, and the second superconducting flux qubit may be bistable. The superconducting flux qubit may include a loop of superconducting material interrupted by at least one compound Josephson junction. The coupler may include a loop of superconducting material interrupted by at least one Josephson junction. One of the first switch, the second switch, the third switch, or the fourth switch may be a compound Josephson junction. The quantum processor may further include: a second interface to control an off-diagonal term in the first superconducting flux qubit; and a third interface to control a diagonal term in the first superconducting flux qubit. The quantum processor may further include: an array of superconducting flux qubits including the first superconducting flux qubit, and the second superconducting flux qubit; and an array of couplers including the coupler. The total number of couplers in the array of couplers may be defined by a linear relationship to the total number of qubits in the array of superconducting flux qubits.

A quantum processor may be summarized as including: an array of superconducting flux qubits, wherein a respective qubit in the array of superconducting flux qubits includes a loop of superconducting metal interrupted by one or more Josephson junctions, including a first coupling portion, and a first switch in parallel with the first coupling portion of the respective qubit; an array of couplers, wherein a respective coupler includes a loop of superconducting metal including a second coupling portion, and a second switch in parallel with the second coupling portion of the respective coupler, and the second coupling portion of the coupler is arranged with respect to the first coupling portion of the respective qubit in the array of superconducting flux qubits to effect a magnetic coupling; a first interface to control an off-diagonal term to at least one qubit in the array of superconducting flux qubits; a second interface to control a diagonal term to at least one qubit in the array of superconducting flux qubits; and a third interface to control the first switch and the second switch to couple at least one qubit in the array of superconducting flux qubits with at least one coupler in the array of couplers.

The inductance of the respective coupler in the array of couplers may be less than the respective qubit in the array of superconducting flux qubits. The respective coupler in the array of couplers may be monostable and the respective qubit in the array of superconducting flux qubits may be bistable. The respective coupler may include a third coupling portion and a third switch in parallel with the third coupling portion of the respective coupler. The quantum processor may further include a second respective qubit in the array of superconducting flux qubits wherein the second respective qubit in the array of superconducting flux qubits may further include a fourth coupling portion and a loop of superconducting metal interrupted by one or more Josephson junctions, a fourth switch in parallel with the fourth coupling portion of the second respective qubit, wherein the fourth coupling portion of the second respective qubit is arranged with respect to the third coupling portion of the couplers to effect a magnetic coupling. One of the first switch and the second switch may be a compound Josephson junction. One of the first switch the second switch, the third switch, or the fourth switch may be a compound Josephson junction. The total number of couplers in the array of couplers may be defined by a linear relationship to the total number of qubits in the array of superconducting flux qubits.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been selected for ease of recognition in the drawings.

DETAILED DESCRIPTION

Figure 1:
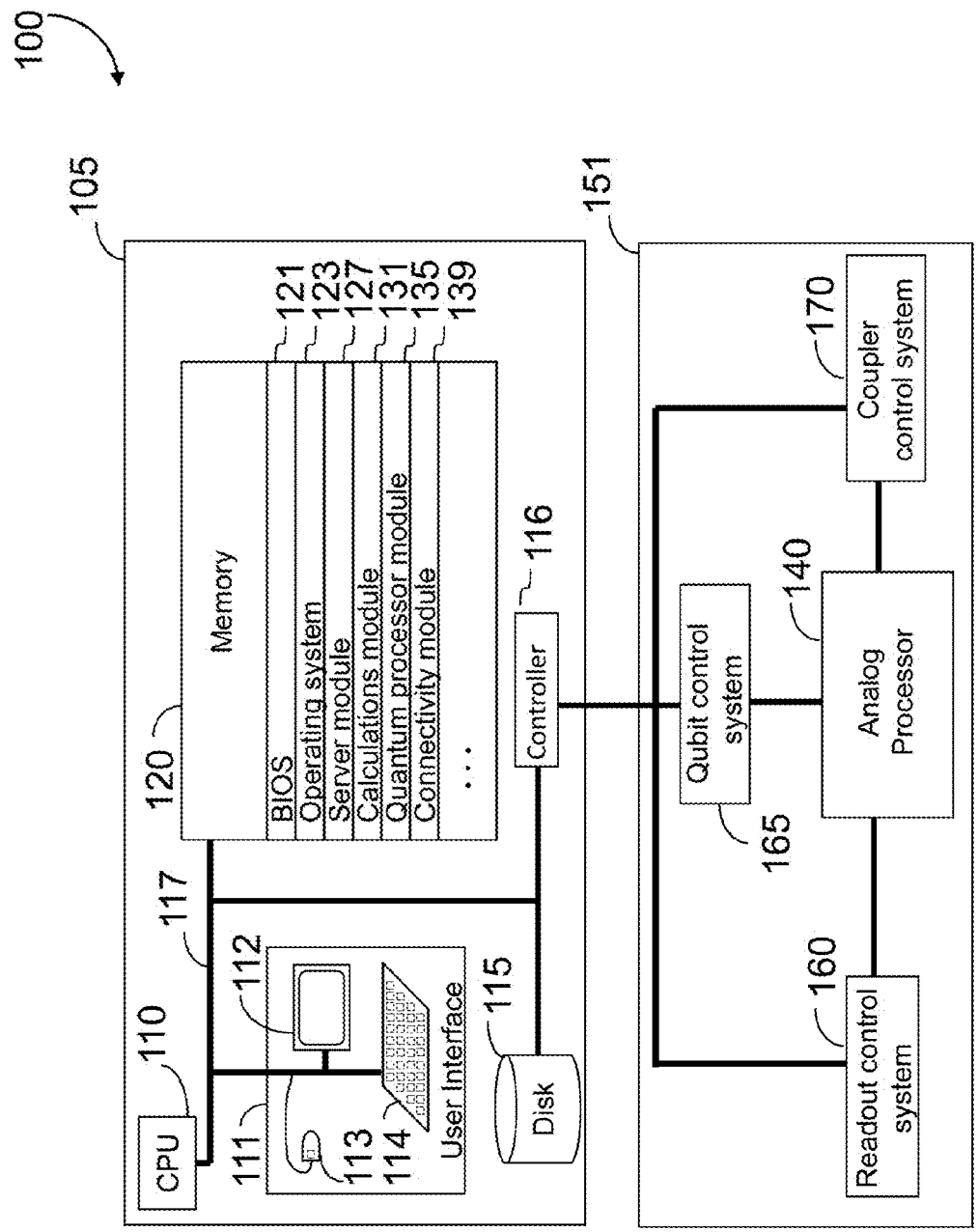
FIG. 1 is a schematic diagram that illustrates an exemplary hybrid computer including a digital processor and an analog processor in accordance with the present methods, systems and devices.

In the following description, some specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with quantum processors, such as quantum devices, couplers, and control systems including microprocessors and drive circuitry have not been shown or described in detail to avoid unnecessarily obscuring descriptions of the embodiments of the present methods. Throughout this specification and the appended claims, the words "element" and "elements" are used to encompass, but are not limited to, all such structures, systems, and devices associated with quantum processors, as well as their related programmable parameters.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" "an embodiment", "another embodiment", "one example", "an example", or "another example" means that a particular referent feature, structure, or characteristic described in connection with the embodiment or example is included in at least one embodiment or example. Thus, the appearances of the phrases "in one embodiment", "in an embodiment", "another embodiment" or the like in various places throughout this specification are not necessarily all referring to the same embodiment or example. Furthermore, the particular features, structures, or characteristics may be combined in any suitable manner in one or more embodiments or examples.

It should be noted that, as used in this specification and the appended claims, the singular forms "a," "an," and "the" include plural referents unless the content clearly dictates otherwise. Thus, for example, reference to a problem-solving system including "a quantum processor" includes a single quantum processor, or two or more quantum processors. It should also be noted that the term "or" is generally employed in its sense including "and/or" unless the content clearly dictates otherwise.

The headings provided herein are for convenience only and do not interpret the scope or meaning of the embodiments.

The various implementations described herein provide techniques to advance quantum computing systems. These advances include improving computing systems previously associated with, gate model quantum computing, quantum annealing, and/or adiabatic quantum computing. An advance is to provide different processor or hardware graphs that allow for a plurality of different programmed or logically defined connectivities. The ability to set different programmed or logically defined connectivities is advantageous for creating and/or using a quantum computer. In some implementations, this advance includes a processor or hardware graph (e.g., updated working processor or hardware graph) that supports an arbitrary number of possible connections between all physically available qubits. In some implementations, there may be two limits on the arbitrary number of possible physical connections for a physical qubit. One, the number of possible connections cannot exceed the quadratic number of edges in a complete graph. Two, each physical qubit is limited in the number of possible connections (i.e., direct connections without intervening qubits), for example to 10 possible connections. In some implementations, these connections are set at calibration time (i.e., during calibration stage). In some implementations, these connections are set at configuration time (i.e., during configuration stage).

FIG. 1 illustrates a hybrid computing system 100 including a digital computer 105 coupled to an analog computer 151. In some implementations the analog computer 151 is a quantum computer and the digital computer 105 is a classical computer. The exemplary digital computer 105 includes a digital processor that may be used to perform classical digital processing tasks described in the present systems and methods. Those skilled in the relevant art will appreciate that the present systems and methods can be practiced with other digital computer configurations, including hand-held devices, multiprocessor systems, microprocessor-based or programmable consumer electronics, personal computers ("PCs"), network PCs, mini-computers, mainframe computers, and the like, when properly configured or programmed to form special purpose machines.

Digital computer 105 will at times be referred to in the singular herein, but this is not intended to limit the application to a single digital computer. The present systems and methods can also be practiced in distributed computing environments, where tasks or sets of instructions are performed or executed by remote processing devices, which are linked through a communications network. In a distributed computing environment, sets of computer- or processor-readable instructions, sometimes denominated as program modules, may be located in both local and remote memory storage devices.

Unless described otherwise, the construction and operation of the various blocks shown in FIG. 1 are of conventional design. As a result, such blocks need not be described in further detail herein, as they will be understood by those skilled in the relevant art.

Digital computer 105 may include at least one processing unit (such as, central processor unit 110), at least one system memory 120, and at least one system bus 117 that couples various system components, including system memory 120 to central processor unit 110. The at least one processing unit may be any logic processing unit, such as one or more central processing units ("CPUs"), digital signal processors ("DSPs"), application-specific integrated circuits ("ASICs"), etc.

Digital computer 105 may include a user input/output subsystem 111. In some implementations, the user input/output subsystem includes one or more user input/output components such as a display 112, mouse 113 and/or keyboard 114.

System bus 117 can employ any known bus structures or architectures, including a memory bus with a memory controller, a peripheral bus, and a local bus. System memory 120 may include non-volatile memory, such as read-only memory ("ROM"), static random access memory ("SRAM"), Flash NAND; and volatile memory such as random access memory ("RAM") (not shown). An basic input/output system ("BIOS") 121, which can form part of the ROM, contains basic routines that help transfer information between elements within digital computer 105, such as during startup.

Digital computer 105 may also include other non-volatile memory 115. Non-volatile memory 115 may take a variety of forms, including: a hard disk drive for reading from and writing to a hard disk, an optical disk drive for reading from and writing to removable optical disks, and/or a magnetic disk drive for reading from and writing to magnetic disks. The optical disk can be a CD-ROM or DVD, while the magnetic disk can be a magnetic floppy disk or diskette. Non-volatile memory 115 may communicate with digital processor via system bus 117 and may include appropriate interfaces or controllers 116 coupled to system bus 117. Non-volatile memory 115 may serve as long-term storage for computer- or processor-readable instructions, data structures, and other data for digital computer 105.

Although digital computer 105 has been described as employing hard disks, optical disks and/or magnetic disks, those skilled in the relevant art will appreciate that other types of non-volatile computer-readable media may be employed, such a magnetic cassettes, flash memory cards, Flash, ROMs, smart cards, etc. Those skilled in the relevant art will appreciate that some computer architectures conflate volatile memory and non-volatile memory. For example, data in volatile memory can be cached to non-volatile memory. Or a solid-state disk that employs integrated circuits to provide non-volatile memory. Some computers place data traditionally stored on disk in memory. As well, some media that is traditionally regarded as volatile can have a non-volatile form, e.g., Non-Volatile Dual In-line Memory Module variation of Dual In Line Memory Modules.

Various sets of computer- or processor-readable instructions, application programs and/or data can be stored in system memory 120. It is convenient to call these sets of computer- or processor-readable instructions, application programs and/or data program modules or include module in the name. For example, system memory 120 may store an operating system 123, and a set of computer- or processor-readable server instructions (i.e., server modules) 127. In some implementations, server module 127 includes instruction for communicating with remote clients and scheduling use of resources including resources on the digital computer 105 and analog computer 151. For example, a Web server application and/or Web client or browser application for permitting digital computer 105 to exchange data with sources via the Internet, corporate Intranets, or other networks, as well as with other server applications executing on server computers.

In some implementations system memory 120 may store a set of computer- or processor-readable instructions calculation instructions (i.e., calculation module 131) to perform pre-processing, co-processing, and post-processing to analog computer 151. In accordance with the present systems and methods, system memory 120 may store at set of analog computer interface instructions (i.e., computer interface modules) 135 operable to interact with the analog computer 151.

While shown in FIG. 1 as being stored in system memory 120, the sets of computer- or processor-readable instructions shown and other data can also be stored elsewhere including in nonvolatile memory 115.

The analog computer 151 is provided in an isolated environment (not shown). For example, where the analog computer 151 is a quantum computer, the environment shields the internal elements of the quantum computer from heat, magnetic field, and the like. The analog computer 151 includes an analog processor 140. Examples of an analog processor include quantum processors such as those shown in FIG. 2.

Figure 2:
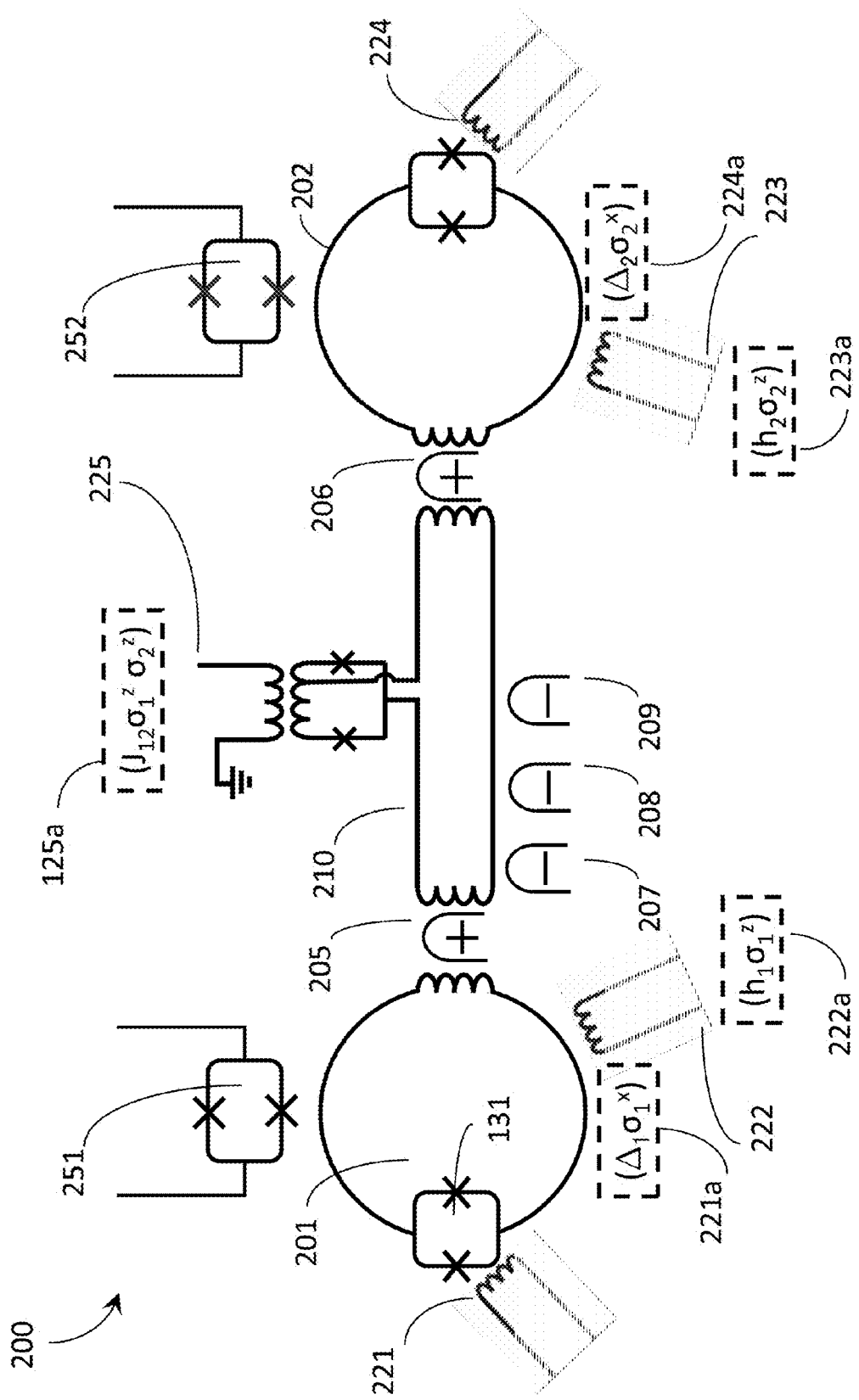
FIG. 2 is a schematic diagram that illustrates a portion of an exemplary superconducting quantum processor, which is an example of an analog processor from FIG. 1, in accordance with the present methods, systems and devices.
Figure 3:
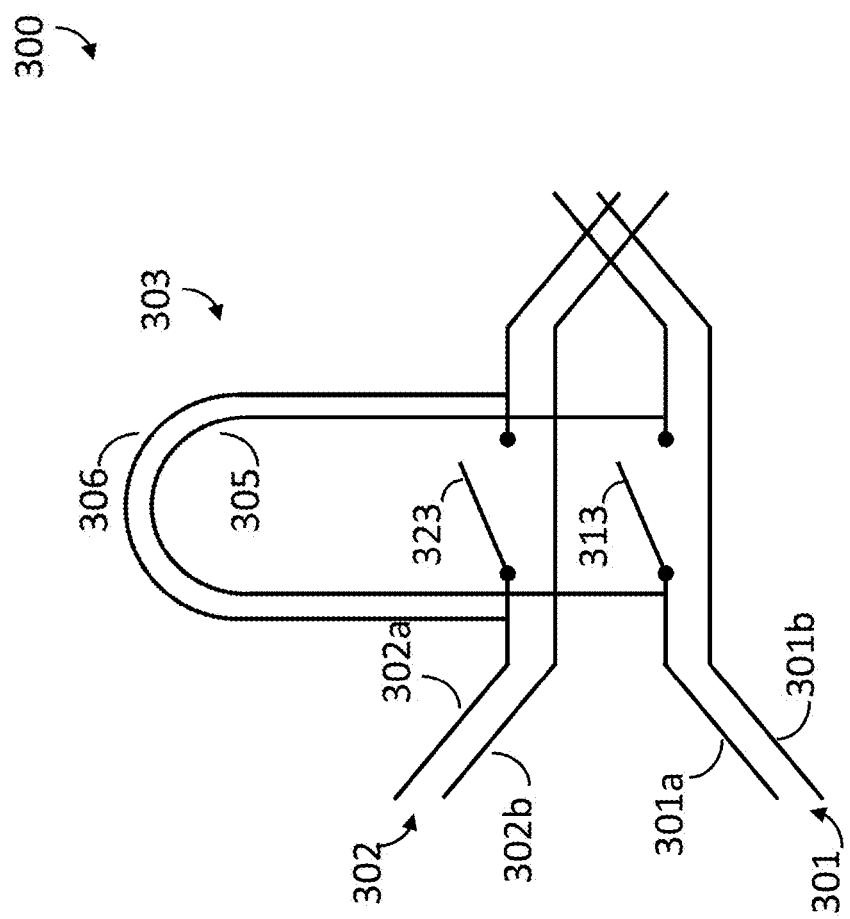
FIG. 3 illustrates an exemplary half-coupler in accordance with the present methods, systems and devices.
Figure 6:
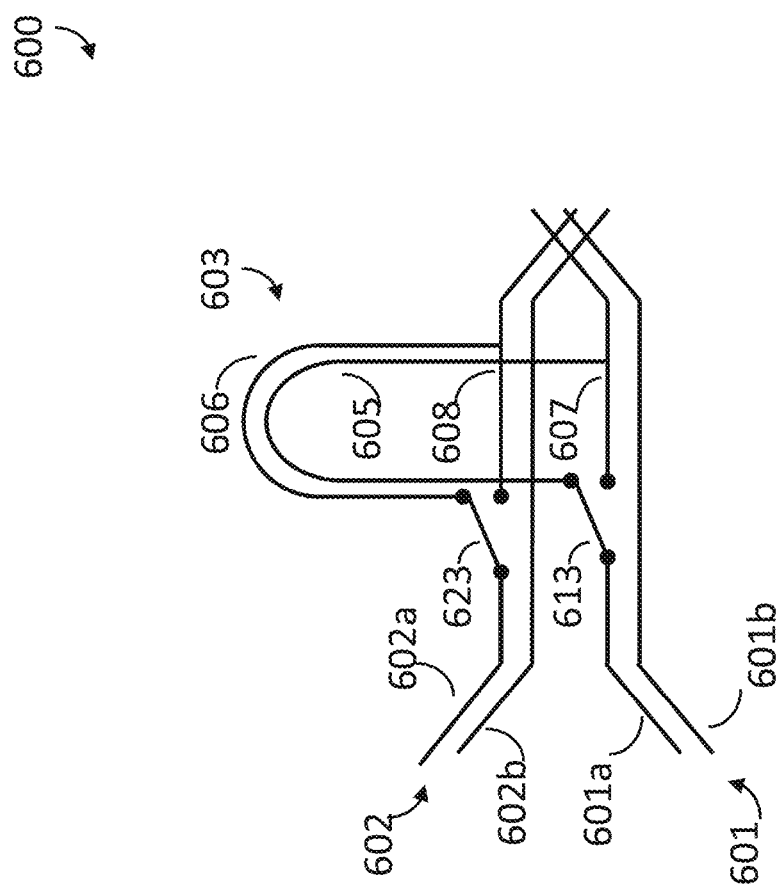
FIG. 6 illustrates an exemplary half-coupler in accordance with the present methods, systems and devices.

A quantum processor includes programmable elements such as qubits, couplers, and other devices. The qubits are readout via readout out system 160. These results are fed to the various sets of computer- or processor-readable instructions in the digital computer 105 including server modules 127, calculation module 131, analog computer interface modules 135, or other modules stored in nonvolatile memory 115, returned over a network or the like. The qubits are controlled via qubit control system 165. The qubits, including the qubits of FIGS. 2, 7, 8, 9, 12, and the like, are controlled via qubit control system 165. The couplers are controlled via coupler control system 170. The couplers, including the half-couplers of FIGS. 2, 3, and 6 are controlled via coupler control system 170. The couplers, including the couplers of FIGS. 7, 8, 9, and 12 are controlled via coupler control system 170. In some implementations, the quantum processor has programmable or logically configurable imposed connectivity as discussed herein. In some implementations of the qubit control system 165 and the coupler control system 170 are used to implement quantum annealing as described herein on analog processor 140. In some implementations, qubits, couplers, or superconducting devices may have tunable inductance and are controlled by a single control system like coupler control system 170 or qubit control system 165.

In some implementations, system memory 120 may store a set of computer- or processor-readable connectivity instructions 139 to program, apply, update or otherwise impose a connectivity (i.e., imposed connectivity) of or on the programmable elements of analog computer 151. Terms employing the phrase "imposed connectivity" refer to the connectivity that is programmed, applied or otherwise imposed on a quantum processor. As explained above, the imposed connectivity may cause one or more components and/or communicative paths to be that would otherwise be physically available to be omitted from availability. As also explained above, the imposed connectivity may specify a measure or level of programmed or logical connectiveness (i.e., maximum number of direct communicative coupling paths that are logically available, whether active or not, to communicably couple between two individual qubits in a quantum processor without the use of intervening qubits), prior to a mapping or embedding of a specific problem. The imposed connectivity may be based on a current or most recent calibration and/or configuration, prior to mapping or embedding a problem or problem graph.

For example, the set of computer- or processor-readable connectivity instructions, or connectivity module 139, can impose and/or control connections between one or more elements in the processor of the analog computer 151. In accordance with the present systems and methods, connectivity module 139 takes the form of computer- or processor-executable instructions to receive data from digital computer 105 to establish a connectivity of a quantum processor at calibration and/or configuration time(s) or stage(s). In some implementations, connectivity module 139 takes the form of computer- or processor-executable instructions to establish an imposed connectivity of a quantum processor at or prior to calibration stage, configuration stage, or embedding stage. The connectivity module 139 may, for example, make only a portion of the entire quantum processor available for mapping or embedding a problem graph. One or more processors (e.g., digital processors) executing the instructions may also generate a corresponding processor or hardware graph (e.g., working processor or hardware graph, updated working processor or hardware graph) which represents the quantum processor with the imposed connectivity.

The quantum processor may perform one, or likely more, executions on a problem or problems during runtime. In some implementations, connectivity module 139 takes the form of computer- or processor-executable instructions to establish a new respective logical calibration and/or configuration imposed connectivity of a quantum processor for each calibration and/or configuration of the quantum processor.

In some implementations, connectivity module 139 takes the form of instructions to check connectivity between qubits.

In some implementations the digital computer 105 can operate in a networking environment using logical connections to at least one client computer system. In some implementations the digital computer 105 is coupled via logical connections to at least one database system. These logical connections may be formed using any means of digital communication, for example, through a network, such as a local area network ("LAN") or a wide area network ("WAN") including, for example, the Internet. The networking environment may include wired or wireless enterprise-wide computer networks, intranets, extranets, and/or the Internet. Other implementations may include other types of communication networks such as telecommunications networks, cellular networks, paging networks, and other mobile networks. The information sent or received via the logical connections may or may not be encrypted. When used in a LAN networking environment, digital computer 105 may be connected to the LAN through an adapter or network interface card ("NIC") (communicatively linked to system bus 117). When used in a WAN networking environment, digital computer 105 may include an interface and modem (not shown), or a device such as NIC, for establishing communications over the WAN. Non-networked communications may additionally, or alternatively be employed.

In accordance with some implementations of the present systems and devices, a quantum processor may be designed to perform quantum annealing and/or adiabatic quantum computation. An evolution Hamiltonian is proportional to the sum of a first term proportional to the problem Hamiltonian and a second term proportional to the delocalization Hamiltonian. As previously discussed, a typical evolution may be represented by Equation (4):

$$H_E \propto A(t)H_D + B(t)H_P \qquad (4)$$

where $H_P$ is the problem Hamiltonian, delocalization Hamiltonian is $H_D$, $H_E$ is the evolution or instantaneous Hamiltonian, and A(t) and B(t) are examples of an evolution coefficient which controls the rate of evolution. In general, evolution coefficients vary from 0 to 1. A common delocalization Hamiltonian is shown in Equation (5):

$$H_D \propto -\frac{1}{2} \sum_{i=1}^{N} \Delta_i \sigma_i^x \qquad (5)$$

where N represents the number of qubits, $\sigma_i^x$ is the Pauli x-matrix for the $i^{th}$ qubit and A is the single qubit tunnel splitting induced in the $i^{th}$ qubit. Here, the $\sigma_i^x$ terms are examples of "off-diagonal" terms. A common problem Hamiltonian includes first component proportional to diagonal single qubit terms and a second component proportional to diagonal multi-qubit terms. The problem Hamiltonian, for example, may be of the form:

$$H_P \propto -\frac{\varepsilon}{2}\left[\sum_{i=1}^{N} h_i \sigma_i^z + \sum_{j>i}^{N} J_{ij} \sigma_i^z \sigma_j^z\right] \qquad (6)$$

where N represents the number of qubits, $\sigma_i^z$ is the Pauli z-matrix for the $i^{th}$ qubit, $h_i$ and $J_{ij}$ are dimensionless local fields for the qubits, and couplings between qubits, and $\varepsilon$ is some characteristic energy scale for Hp. Here, the $\sigma_i^z$ and $\sigma_i^z \sigma_j^z$ terms are examples of "diagonal" terms. The former is a single qubit term and the latter a two qubit term. Throughout this specification, the terms "problem Hamiltonian" and "final Hamiltonian" are used interchangeably. Hamiltonians such as $H_D$ and $H_P$ in Equations (5) and (6), respectively, may be physically realized in a variety of different ways. A particular example is realized by an implementation of superconducting qubits.

FIG. 2 is a schematic diagram of a portion of an exemplary superconducting quantum processor 200 which may be used to implement the present methods, systems and devices. A quantum processor may be used to implement quantum computing, such as, gate model quantum computing, quantum annealing, and/or adiabatic quantum computing.

The portion of superconducting quantum processor 200 shown in FIG. 2 includes two superconducting qubits 201, and 202. Also shown is a tunable $\sigma_i^z \sigma_j^z$ coupling (diagonal coupling) via two engaged half-couplers 205 and 206 plus a coupler 210. The coupler 210 couples information therebetween qubits 201 and 202 (i.e., providing pair-wise or 2-local coupling between). The two engaged half-couplers 205 and 206 couple the qubits 201 and 202 to the coupler 210. Unengaged half-couplers 207, 208, 209, etc., are proximate to the coupler 210 and are also proximate to other couplers not shown. While the portion of quantum processor 200 shown in FIG. 2 includes only two qubits 201, 202 and one coupler 210, those of skill in the art will appreciate that quantum processor 200 may include any number of qubits and any number of coupling devices coupling information therebetween.

The portion of quantum processor 200 shown in FIG. 2 may be implemented to physically realize quantum annealing and/or adiabatic quantum computing by initializing the system with an initial Hamiltonian and evolving the system to the problem Hamiltonian in accordance with the evolution described by Equation (4). Quantum processor 200 includes a plurality of interfaces 221-125 that are used to configure and control the state of quantum processor 200. Each of interfaces 221-225 may be realized by a respective inductive coupler, as illustrated, as part of a programming subsystem and/or an evolution subsystem. Such a programming subsystem and/or evolution subsystem may be separate from quantum processor 200, or it may be included locally (i.e., on-chip with quantum processor 200) as described in, for example, U.S. Pat. Nos. 7,876,248; and 8,035,540.

In the operation of quantum processor 200, interfaces 221 and 224 may each be used to couple a flux signal into a respective compound Josephson junction 231 and 232 of qubits 201 and 202, thereby realizing the $\Delta_i$ terms in the system Hamiltonian. This coupling provides the off-diagonal $\sigma^x$ terms of the system Hamiltonian described by Equation (5) and these flux signals are examples of "delocalization signals." Similarly, interfaces 222 and 223 may each be used to couple a flux signal into a respective qubit loop of qubits 201 and 202, thereby realizing the $h_i$ terms in the system Hamiltonian. These interfaces provide the single qubit diagonal $\sigma^z$ terms of Equation (6). Furthermore, interface 225 may be used to couple a flux signal into coupler 210, thereby realizing the $J_{ij}$ term in the system Hamiltonian. This coupling provides the multi-qubit diagonal ($\sigma_i^z \sigma_j^z$) terms of Equation (6). In FIG. 2, if qubit 201 is denoted by index 1 and qubit 202 by index 2 then the contribution of each of interfaces 221-225 to the terms system Hamiltonian is indicated in broken line boxes 221a-225a.

Throughout this specification and the appended claims, the term "quantum processor" is used to generally describe a collection of components including physical qubits (e.g., qubit 201 and qubit 202) and couplers (e.g., coupler 210). The physical qubits and the couplers are referred to as the "programmable elements" of the quantum processor 200 and their corresponding parameters (e.g., the qubit $h_i$ values and the coupler $J_{ij}$ values) are referred to as the "programmable parameters" of the quantum processor. In the context of a quantum processor, the term "programming subsystem" is used to generally describe the interfaces (e.g., "programming interfaces" 222, 223, and 225) used to apply the programmable parameters (e.g., the $h_i$ and $J_{ij}$ terms) to the programmable elements of the quantum processor 200 and other associated control circuitry and/or instructions. As previously described, the programming interfaces of the programming subsystem may communicate with other subsystems which may be separate from the quantum processor or may be included locally on the processor. As described in more detail later, the programming subsystem may be configured to receive programming instructions in a machine language of the quantum processor and execute the programming instructions to program the programmable elements in accordance with the programming instructions. Similarly, in the context of a quantum processor, the term "evolution subsystem" generally includes the interfaces (e.g., "evolution interfaces" 221 and 224) used to evolve the programmable elements of the quantum processor 200 and other associated control circuitry and/or instructions. For example, the evolution subsystem may include annealing signal lines and their corresponding interfaces (221, 224) to the qubits (201, 202).

Quantum processor 200 also includes readout devices 251 and 252. Here readout device 251 is associated with qubit 201 and readout device 252 is associated with qubit 202. The readout devices are operable to read out the state of their associated qubits. In some embodiment such as shown in FIG. 2, each of readout devices 252 and 252 comprises a respective DC-SQUID that is inductively coupled to a corresponding qubit. In the context of quantum processor 200, the term "readout subsystem" is used to generally describe the readout devices 251, 252 used to read out the final states of the qubits (e.g., qubits 201 and 202) in the quantum processor to produce a bit string. The readout subsystem may also include other elements, such as routing circuitry (e.g., latching elements, a shift register, or a multiplexer circuit) and/or may be arranged in alternative configurations (e.g., an XY-addressable array, an XYZ-addressable array, etc.). Qubit readout may also be performed using alternative circuits, such as that described in PCT Patent Publication WO2012064974.

While FIG. 2 illustrates only two physical qubits 201, 202; a pair of half-couplers 205, 206; one coupler 210; and two readout devices 251, 252, a quantum processor (e.g., processor 200) may employ any number of qubits, couplers, and/or readout devices, including a larger number (e.g., hundreds, thousands or more) of qubits, couplers and/or readout devices. The application of the teachings herein to processors with a different (e.g., larger) number of computational components should be readily apparent to those of ordinary skill in the art.

Examples of superconducting qubits include superconducting flux qubits, superconducting charge qubits, and the like. In a superconducting flux qubit, the Josephson energy dominates or is equal to the charging energy. In a charge qubit, it is the reverse. Examples of flux qubits that may be used include rf-SQUIDs, which include a superconducting loop interrupted by one Josephson junction, persistent current qubits, which include a superconducting loop interrupted by three Josephson junctions, and the like. See, examples of rf-SQUID qubits in Bocko, et al., 1997, *IEEE Trans. on Appl. Supercond.* 7, 3638; Friedman, et al., 2000, *Nature* 406, 43; and Harris, et al., 2010, *Phys. Rev. B* 81, 134510; or persistent current qubits, Mooij et al., 1999, *Science* 285, 1036; and Orlando et al., 1999, *Phys. Rev. B* 60, 15398. In addition, hybrid charge-phase qubits, where the energies are equal, may also be used. Further details of superconducting qubits may be found in Makhlin, et al., 2001, *Rev. Mod. Phys.* 73, 357; Devoret et al., 2004, arXiv:cond-mat/0411174; Zagoskin and Blais, 2007, *Physics in Canada* 63, 215; Clarke and Wilhelm, 2008, *Nature* 453, 1031; Martinis, 2009, *Quantum Inf. Process.* 8, 81; and Devoret and Schoelkopf, 2013, *Science* 339, 1169. In some implementations, the qubits and couplers are controlled by on-chip circuitry. Examples of on-chip control circuitry can be found in U.S. Pat. Nos. 7,876,248; 7,843,209; 8,018,244; 8,098,179; 8,169,231; and 8,786,476.

Throughout this specification and the appended claims, the "architecture" or "topology" of a quantum processor is defined by the relative physical positions of the qubits and couplers in the quantum processor. Any given coupler may be ON/OFF depending on the programming configuration of the quantum processor. Which couplings are ON/OFF is a configuration of the quantum processor. ON can have various values ranging from FerroMagnetic (FM) or AntiFerroMagnetic (AFM) with a number of intervening levels. The number of levels is conventionally set by the precision of the control system for the coupler. Conventionally antiferromagnetic coupling is denoted −1, OFF is denoted 0, and ferromagnetic coupling denoted +1. Thus OFF is a value amongst the ON states. Since a programming configuration does not change the physical arrangement (i.e., the "architecture") of the qubits and couplers in the quantum processor, multiple programming configurations may exist for any given architecture of a quantum processor. In other words, the "as manufactured" architecture of a quantum processor is determined or fixed at the time of manufacture. In response to calibration and/or configuration, an imposed or logical architecture of the quantum processor may be determined. As explained above, such may include generation a working processor or hardware graph and/or an updated working processor or hardware graph, for example via one or more digital or classical processors. The working processor or hardware graph and/or an updated working processor or hardware graph may represent a subset of the total available or operational physical components and/or communications path, into which a problem may be mapped or embedded. As discussed herein, the problem may be represented by a problem graph, which may be mapped or embedded via a mapping or embedding system.

Described embodiments and implementations allow connectivity to be logically configured, programmed, applied, set or otherwise imposed on the quantum processor. Connectivity describes connections. A connection is a direct communicative path between two elements (e.g., between two qubits via a single coupler without an intervening qubits). A coupling can be a direct communicative path between two elements (e.g., between two qubits via a single coupler without an intervening qubits) or an indirect communicative coupling between two elements (e.g., between two qubits via another intervening qubit and/or multiple couplers).

FIG. 3 illustrates an exemplary half-coupler in accordance with the present systems and devices. A qubit 301 includes a narrow loop of superconducting metal, a portion of which is shown. Coupler 302 includes a narrow loop of superconducting metal, a portion of which is shown. Between the qubit 301 and the coupler 302 is a half-coupler 303. In some implementations the half-coupler inductively couples the qubit 301 to the coupler 302. An example of an inductive coupling is shown in FIG. 3. In some implementations, wire 301a is interrupted by a switch 313, which switch 313 is in parallel with a loop 305. In some implementations, the return wire 301b of qubit 301 is not so interrupted. Wire 302a of coupler 302 is interrupted by a switch 323. The switch 323 is in parallel with a loop 306. The return wire 202b has no such interruption. The loops 305 and 306 are arranged to create a mutual inductance between qubit and coupler ($M_{qc}$). The mutual inductance plus current leads to a magnetic coupling. When switches 313 and 323 are open there is a coupling. When switches 313 and 323 are closed, the current bypasses loops 305 and 306 and there is substantially no magnetic coupling.

Figure 4:
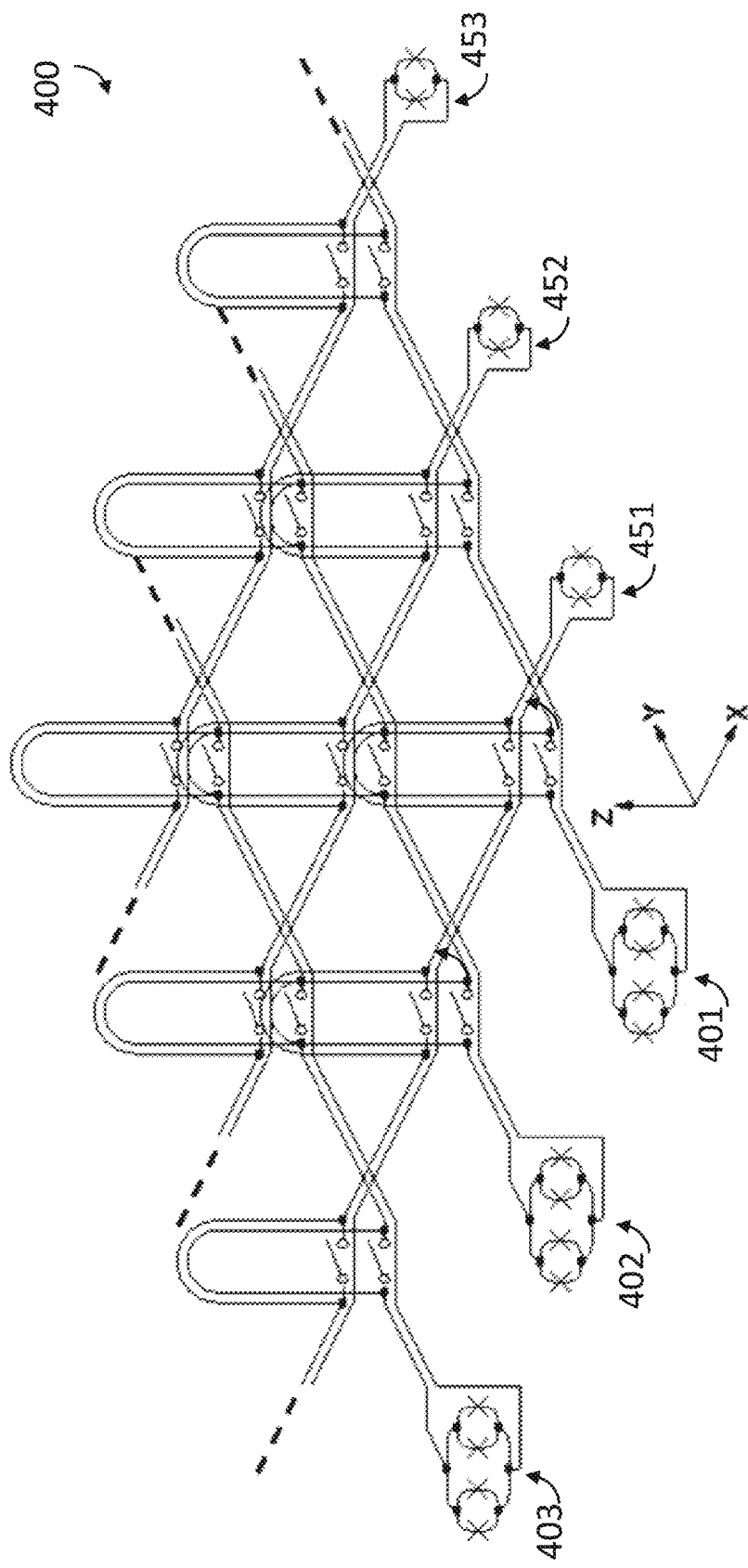
FIG. 4 illustrates an array of qubits and couplers employing the half-coupler of FIG. 3 and which forms the basis of a quantum processor architecture in accordance with the present methods, systems and devices.

FIG. 4 illustrates an array of qubits and couplers employing the half-coupler from FIG. 3 and a portion of a quantum processor architecture in accordance with the present systems and devices. A plurality of qubits 401, 402, etc., are arranged in a plane with a plurality of couplers 451, 452, etc. At the intersection of each coupler and each qubit is a half-coupler such as described in FIG. 3.

In some implementations, the array 400 includes qubits including compound Josephson junctions. In some implementations, the loop of superconducting material that forms the qubit body is interrupted by one compound Josephson junction. In some implementations, the loop of superconducting material that forms the qubit body is interrupted by at least one compound Josephson junction. See FIG. 4.

In some implementations, the array 400 includes couplers including compound Josephson junctions. In some implementations, the loop of superconducting material that forms the coupler body is interrupted by one compound Josephson junction. See FIG. 4. In some implementations, the loop of superconducting material that forms the coupler body is interrupted by at least one compound Josephson junction.

Figure 5:
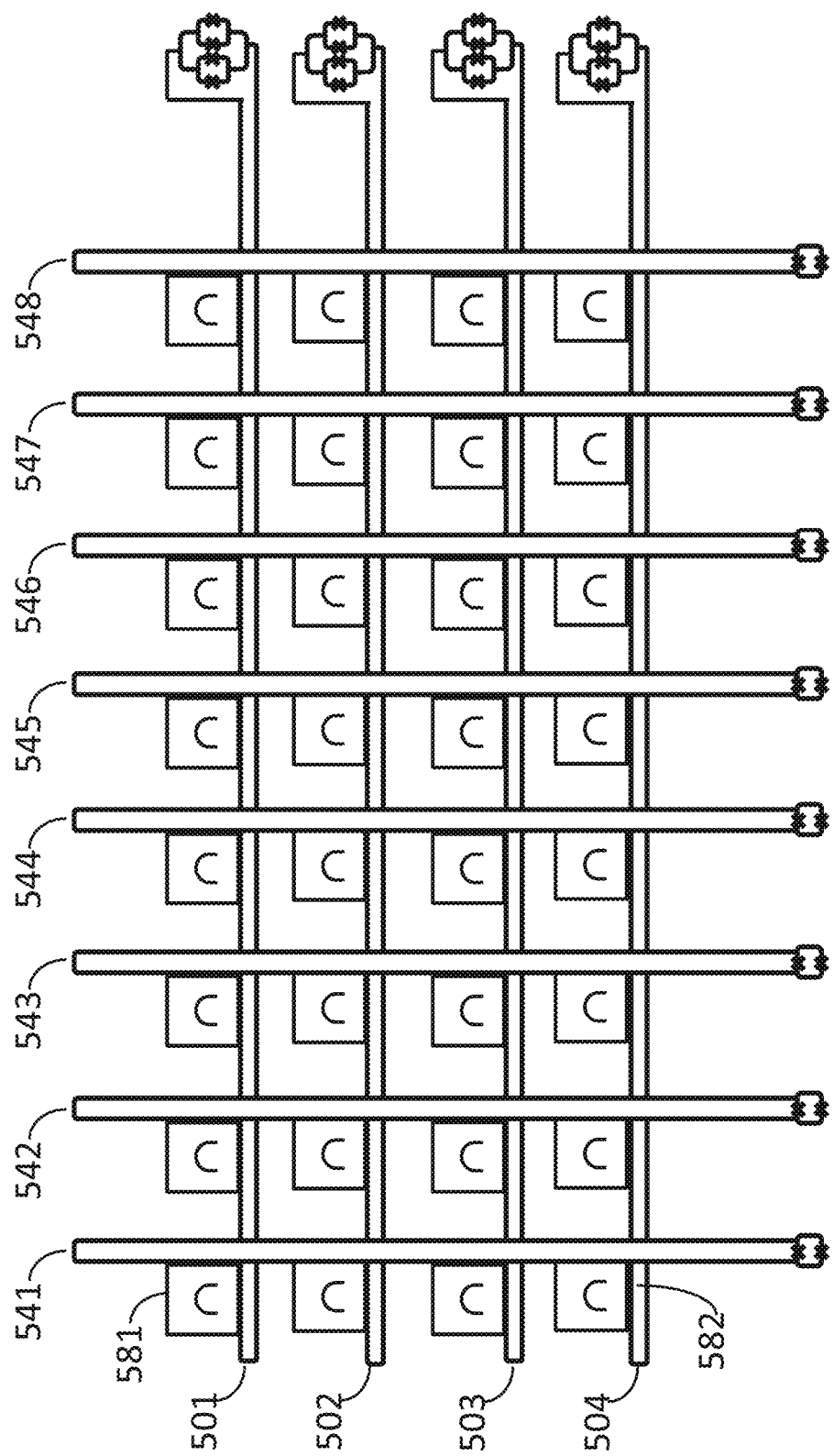
FIG. 5 illustrates an array of qubits and couplers in a quantum processor architecture in accordance with the present methods, systems and devices.

FIG. 5 illustrates an array of qubits and couplers in a quantum processor architecture 500 in accordance with the present systems and devices. The qubits 501, 502, 503, and 504 are generally formed as elongated loops on a horizontal plane (i.e., parallel to the face of the drawing sheet), and are arrayed substantially parallel with one another along a first direction (e.g., horizontally in the orientation of the drawing sheet). The couplers 541, 542, 543, 544, 545, 546, 547, and 548 are generally arrayed parallel to one another and aligned substantially perpendicularly (e.g., vertically in the orientation of the drawing sheet) to the qubits 501, 502, 503, and 504. Half-couplers are placed proximate to the intersection of qubit and couplers. For example, half-coupler 581 can couple qubit 501 and coupler 541, and half-coupler 582 can couple qubit 504 and coupler 541, thus coupling qubits 501 and 504 together.

A person of skill in the art will appreciate that quantum processor architecture 500 allows for imposed connectivities. If a finite number of connections are allowed between qubits but connections can occur between disparate (i.e., non-intersecting, non-adjacent, non-local) qubits then many different connectivities can be imposed.

In some implementations, the length of the qubit is longer than the length of the coupler. When the length of the qubit is longer than the length of the coupler, it is easy to make the inductance of the coupler less than the inductance the qubit. When the inductance of the coupler is less than the inductance the qubit, a person of skill in the art will appreciate that the coupler may be monostable while the qubit, a superconducting flux qubit, is bistable.

The number of qubits and couplers varies with examples of quantum processor. In some implementations, given N qubits there are about ½aN couplers. In some other implementations, there are variously about 2N couplers, 3N couplers, 5N couplers, 10N couplers, 20N couplers, and the like. The presence of more couplers than qubits is helpful in that the qubits are longer than the couplers, which leads to the desired condition of the qubits having a larger inductance than the couplers. In some implementations, the number, a, corresponds to the average, e.g., mean, degree of the vertices of the problem graph. In some implementations, the number, a, corresponds to the maximum degree of the vertices of the problem graph. Examples for the number of qubits vary. In some implementations there are about 500 qubits. In some other implementations there are variously about 100, 250, 1000, 2000, 3000, 5000, and the like. In some implementations, the number of couplers is linear in the number of qubits. In such implementations the number of half-couplers is quadratic in the number of qubits.

A person of skill in the art will appreciate that quantum processor architecture 500 allows for the use of devices with tunable inductances. For example, qubits 501, 502, 503, and 504 include loops of superconducting material interrupted by a compound compound Josephson junction (CCJJ). By biasing a CCJJ in a qubit, the qubit can be transformed into a coupler. See discussion in FIGS. 7, 8, and the like. FIG. 6 illustrates an exemplary half-coupler in accordance with the present systems and devices. A qubit 601 includes a narrow loop of superconducting metal, a portion of which is shown. Coupler 602 includes a narrow loop of superconducting metal, a portion of which is shown. Between the qubit 601 and the coupler 602 is a half-coupler 603. In some implementations, the half-coupler inductively couples the qubit 601 to the coupler 602. An example of an inductive coupling is shown in FIG. 6. In some implementations, wire 601a is interrupted by a switch 613, which switch 613 when set at a first position (as shown) is in series with a loop 605. When switch 613 is set in a second position, the switch 613 is in series with and selects a bypass 607 to loop 605. In some implementations, the return wire 601b of qubit 601 is not so interrupted. Wire 602a of coupler 602 is interrupted by a switch 623 which when set at a first position (as shown) is in series with a loop 606. When switch 623 is set in a second position, the switch 623 is in series with and selects a bypass 608 to loop 606. In some implementations the return wire 502b is not so interrupted. The loops 605 and 606 are arranged to create a mutual inductance between qubit and coupler ($M_{qc}$). When switches 613 and 623 are both in their respective first positions selecting the loops 605 and 606, there is a coupling. When switches 613 and 623 are in a second position, the loops 605 and 606 are bypassed and there is substantially no coupling.

A difference between the implementations of FIG. 6 and FIG. 3 is the location of the switches. In FIG. 3, the switches were in parallel with the loops. Here a switch, such as switch 613, is in series with a loop or bypass, such as, loop 605 and bypass 607. The switch is used to select a current path through the loop or to bypass the loop.

In some implementations, only one of the qubit or the coupler such as those shown in FIGS. 3 and 6 includes a switch. The half-couplers shown in FIGS. 3 and 6 include two switches. Examples of switches include a compound Josephson junction or a DC-SQUID. Included in a DC-SQUID is a loop of superconducting material interrupted by one or more Josephson junctions. In a DC-SQUID there are two leads attached to the loop and current can travel from one lead to the other through the loop. When a magnetic field is applied to the loop, the current in the loop resists the flux by generating a screening current. As the amount of flux in the loop reaches one flux-quantum the current from one lead to another approaches zero.

In operating a quantum processor including half-couplers, a coupling between two qubits can be accomplished by a method as set forth below. The method imposes a connection between two qubits. For the method, as with other methods taught herein, the various acts may be performed in a different order than described. Additionally, the methods can omit some acts, and/or employ additional acts. One or more of these acts may be performed by or via one or more circuits, for instance one or more processors (e.g., digital processors such as microprocessors, analog processor such as quantum processors, a hybrid computer including a digital processor and an analog processor, such as, hybrid computer 100). In some implementations, the method is performed by a machine running the set of computer- or processor-readable connectivity instructions 139 of FIG. 1. The method can be performed by quantum computer controller, a processor based device. In some implementations, the method is performed by hybrid computer. This example is used in the description of the method.

The method includes the hybrid computer opening a first switch on a first qubit at a first half-coupler, and opening a second switch on a coupler at the first half-coupler. The first qubit, the coupler, the half-coupler, and the like are on a quantum processor, such as, shown in FIG. 2. The opening of the first switch and the opening second switch creates a magnetic coupling between the first qubit and the coupler via the first half-coupler. The method further includes the hybrid computer opening a third switch on the coupler at a second half-coupler, and opening a fourth switch on a second qubit at a first half-coupler. The opening of the third switch and the opening of the fourth switch creates a magnetic coupling between the coupler and the first qubit via the second half-coupler, and couples the first qubit to the second qubit via the first half-coupler, the coupler, and the second half-coupler.

Additional operations may be included in the method. In some implementations, the method includes applying a delocalization signal to the first qubit. In some implementations, the method includes removing the delocalization signal to the first qubit, wherein the delocalization signal includes an off-diagonal term. In some implementations, the method includes applying a local bias to the first qubit, wherein the local bias includes a diagonal term.

The method to couple two qubits can be accomplished under different situations. In some implementations, the coupling between the first qubit and the second qubit is a multi-qubit diagonal term. In some implementations, the first qubit is a bistable SQUID, the second qubit is a bistable SQUID, and the coupler is a monostable SQUID. In some implementations, the first half-coupler includes a first portion of the first qubit, a second portion of the coupler, the first switch, and the second switch. In some implementations, the first portion of the first qubit, and the second portion of the coupler are aligned to create a magnetic coupling between the first qubit and the coupler when the first switch is open, and the second switch is open. In some implementations, the first switch is in parallel to the first portion of the first qubit, and the second switch is in parallel to the second portion of the coupler. In some implementations, wherein closing the first switch bypasses the first portion and closing the second switch bypasses the second portion leading to substantially less magnetic coupling between the first qubit and the coupler.

It should be noted that many other architectures may be created by varying the coupling between qubits. As such, the implementations of the invention are not restricted to the illustrative quantum processor architectures presented in the present specification and figures.

Figure 7:
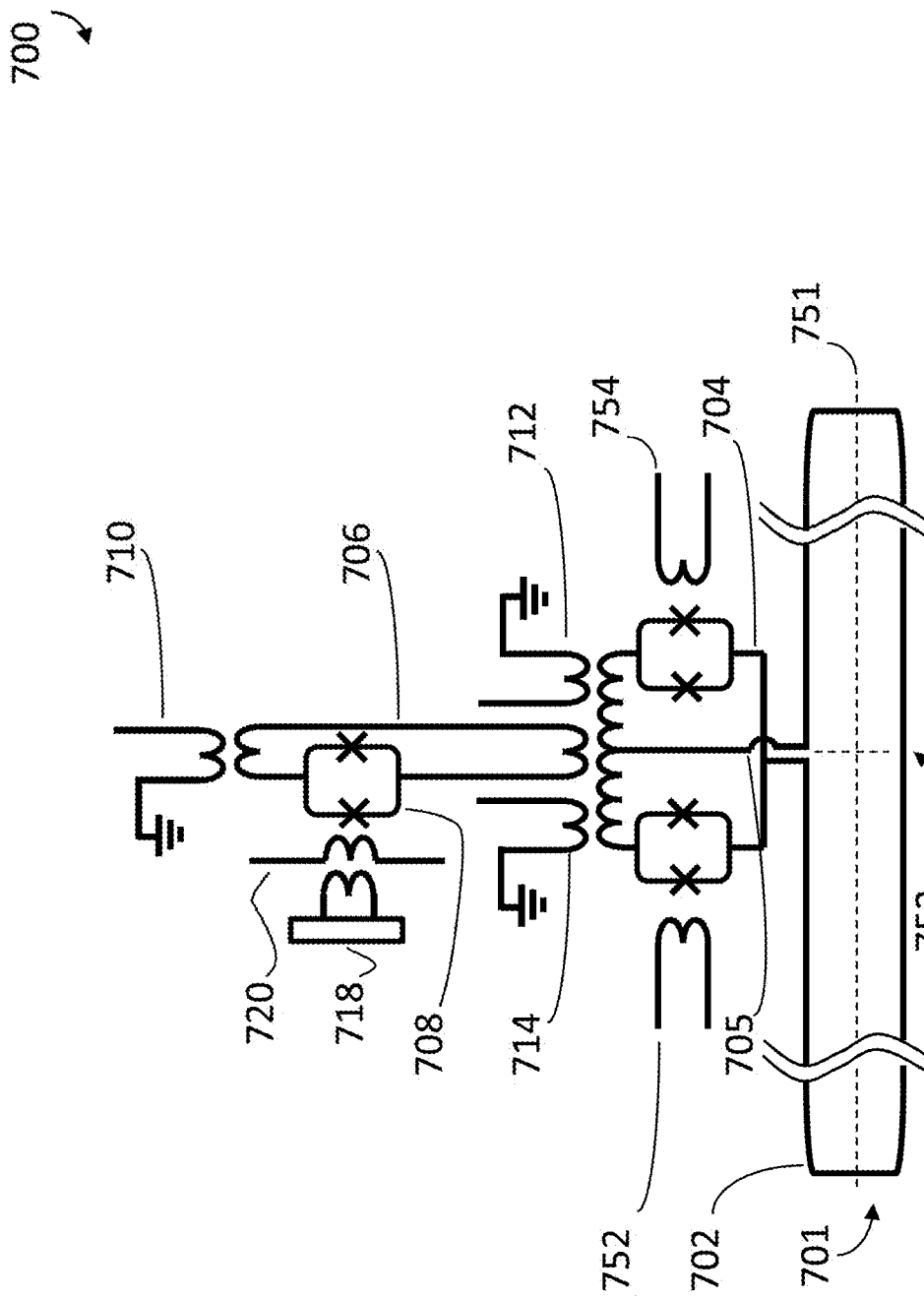
FIG. 7 is a schematic diagram that illustrates a portion of an exemplary superconducting quantum qubit including a plurality of bias lines in accordance with the present methods, systems and devices.

FIG. 7 is a schematic diagram of a portion of an exemplary superconducting quantum processor 700 which may be used to implement the present methods, systems and devices. A quantum processor may be used to implement quantum computing, such as, gate model quantum computing, quantum annealing, and/or adiabatic quantum computing.

The portion of superconducting quantum processor 700 shown in FIG. 7 includes a portion of a superconducting qubit 701. The superconducting qubit 701 includes a loop of superconducting material 702. In some implementations, the loop 702 extends along its major axis 751 many times more than it extends along its minor axis 752. The loop can extend in one direction, as shown, or in many directions with bends. Also shown is a compound compound Josephson Junction (CCJJ) 704 interrupting the loop of superconducting material 702 of the superconducting qubit 701. A flux bias can be applied to CCJJ 704 in a similar way that interfaces 221 and 224 may each be used to couple a flux signal into a respective compound Josephson junction 231 and 232 of qubits 201 and 202 of FIG. 2. Flux may be applied to the major loop or minor loops of CCJJ 704. In the major loop flux may be applied on either or both sides of return line 705.

In some implementations, three bias lines provide a flux bias to the CCJJ 704. A current in a respective line provides a flux bias proportionally to the current in the respective line and the mutual inductance between the respective line and the CCJJ. A first bias line 710 provides an analog current bias to the superconducting qubit 701. A second bias line 712 provides an analog current bias to the superconducting qubit 701. A third bias line 714 provides a digital current bias to the superconducting qubit 701.

As drawn, the bias lines are arranged side-by-side and asymmetrically with respect to the two halves of CCJJ 704. However, this is done for clarity to show three separate bias lines. In some implementations, the bias lines 710, 712, and 714 are arranged to symmetrically bias the two halves of CCJJ 704. For example, the lines could be stacked on top of each other (e.g., extending into or out of the drawing sheet).

The bias line 710 provides an analog current bias to the superconducting qubit 701 via a tunable coupler 706. The tunable coupler 706 is interrupted by a compound Josephson junction 708. When the flux in the compound Josephson junction 708 is tuned, the coupling value can be modulated between and including a first coupling value set by mutual inductances between the bias line 710 and the coupler 706, and the coupler 706 and the superconducting qubit 701, and a second coupling value, zero coupling. Thus, the compound Josephson junction 708 can be decoupled from bias line 710. The flux in the compound Josephson junction 708 can be provided by a bias line and/or on-chip control circuitry. An example of on-chip control circuitry is DAC 718. An example of a bias line is bias line 720. In some implementations, the bias line 710 provides a time dependent global annealing signal to a plurality of qubits on a quantum processor. The time dependent global annealing signal can be used to implement quantum annealing. The use of a global signal during annealing is described further in US Patent Application Publication 2011-0060780.

The bias line 712 provides an analog current bias to the superconducting qubit 701 via an inductive coupling to the CCJJ 704. In some implementations, the current in bias line 712 is provided by off-chip electronics. Examples of off-chip electronics include room temperature electronics. The bias line 712 can be used to implement a pre-bias to the superconducting qubit 701. A pre-bias may be used to bias a qubit, such as superconducting qubit 701, to a mean setting such that the superconducting qubit 701 may be used as a ladder element. A pre-bias may be used to bias a qubit, such as superconducting qubit 701, to such that the flux in CCJJ 705 is at an operating point and a digital bias like, bias line 714 contributes additional flux such that the superconducting qubit 701 may be used as a ladder element.

A ladder element has a monostable energy potential. The ladder element can be included with one or more other ladder elements to form a ladder structure. A ladder structure has a monostable energy potential, such that a first qubit inductively coupled to the ladder structure and the ladder structure effectively operate as a single qubit. Thus, the qubit and the ladder structure can form a logical qubit without penalized tunneling dynamics. A plurality of qubits forming a chain is believed to suffer from penalized tunneling dynamics. For more information on tunneling dynamics in chains of qubits see US Patent Application Publication 2015-0032993. For more information on ladder elements and ladder structures, see U.S. Pat. No. 8,174,305.

The bias line 714 provides a digital bias to the superconducting qubit 701 via an inductive coupling to the CCJJ 704. The current in bias line 714 is a discrete value and may be included locally (i.e., on-chip with quantum processor) as described in, for example, U.S. Pat. Nos. 7,876,248; and 8,035,540. The bias line 714 provides a flux bias to the CCJJ with lower noise in flux bias than bias lines 710 and 712. In some implementations, the variation of the flux provided to CCJJ 704 is about a tenth of a flux quantum ($0.1\Phi_0$).

The use of three bias lines provides a bias to the CCJJ 704 that has a time dependent component with large range and high precision and a time independent component. A first bias line can provide a large flux range and a second bias line can provide a finer resolution on flux bias to the CCJJ 704. For example, hybrid computer 100 can apply a time dependent flux via bias line 710 that varies over tens of milli-flux quanta ($m\Phi_0$) and a time dependent flux via bias line 712 that varies over a half-flux quantum. Line 712 may provide a signal that varies much more coarsely than the signal in line 710. The signal in line 712 can be held a first value during quantum annealing and a second value during the readout of the superconducting qubit 701. The signal in line 710 can be varied to provide the annealing signal.

The portion of quantum processor 700 shown in FIG. 7 may be implemented to physically realize quantum annealing and/or adiabatic quantum computing by initializing the system with an initial Hamiltonian and evolving the system to the problem Hamiltonian in accordance with the evolution described by Equation (4). The portion of quantum processor 700 may be used to create a ladder element with a monostable energy potential. Biasing a qubit to its degeneracy point may yield a ladder element as described in U.S. Pat. No. 8,174,305 and references therein.

In some implementations, a pair of bias lines (752 and 754) provide a pair of flux biases to the compound Josephson junctions in CCJJ 704. A qubit can be made into a coupler by employing a multi-line bias on the CCJJ 704, a symmetric bias to the constituent compound Josephson junctions in CCJJ 704, or an asymmetric bias to the constituent compound Josephson junctions in CCJJ 704. For example, symmetrically biasing to the constituent compound Josephson junctions in CCJJ 704 is equivalent to bias the major loop of the CCJJ 704. The bias may be asymmetric. That is placing a differing amount of flux in the minor loops of CCJJ 704. For example, one compound Josephson junction is biased with half a flux quantum. In an asymmetric bias any flux in the main body of the CCJJ will become a bias to the qubit 701. That is, flux in loop 702.

Alternative bias arrangements are possible. If the main body of the CCJJ 704 is flux biased, aka center biased, then with certain flux biases the qubit becomes a coupler. As explained above, a coupler has a lower normalized inductance than a qubit. An example, of a center flux bias value that that would convert qubit 700 a coupler is a flux approaching one half flux quantum.

Figure 8:
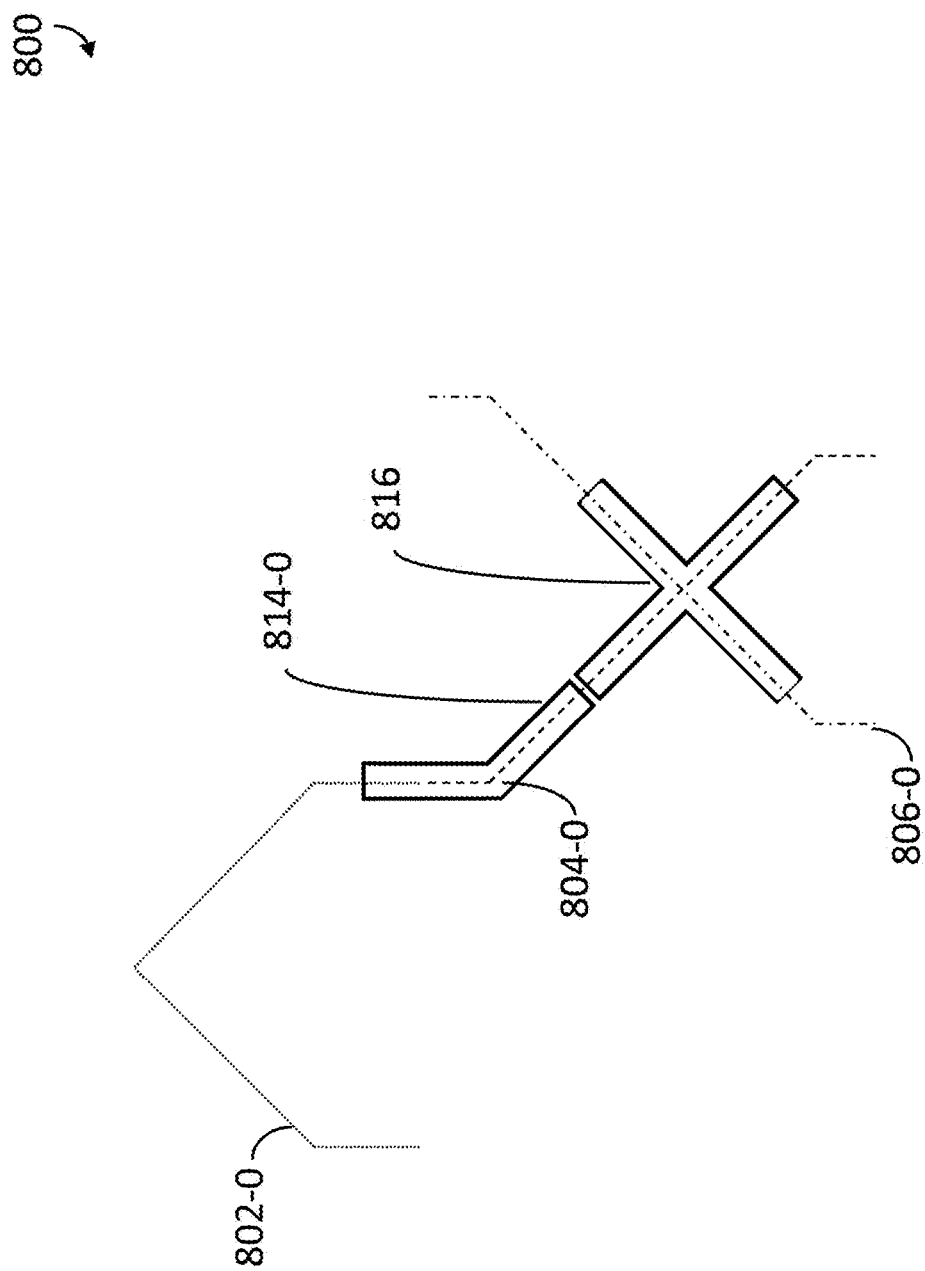
FIG. 8 is a schematic diagram that illustrates a portion of an exemplary superconducting quantum processor including qubits and couplers in accordance with the present methods, systems and devices.

FIG. 8 illustrates a portion of a quantum processor architecture 800 in accordance with the present systems and devices. The qubits are generally formed as elongated loops on a horizontal plane (i.e., parallel to the face of the drawing sheet), and extend in a plurality of directions. For simplicity and clarity, the elongated loops are depicted as a series of one or more line segments. Only three qubits 802-0, 804-0, 806-0 are shown in FIG. 8, but further qubits could be included in quantum processor architecture 800. An example of a qubit is qubit 802-0 here shown with an apical shape. Another example is qubit 804-0 which crosses a like shaped qubit 806-0. In some implementations, one or more of qubits 802-0, 804-0 and 806-0 are tri-biased qubit as shown in FIG. 7.

As used herein and in the claims the term cross, and variants thereof such as crosses or crossing, includes overlie, underlie, and overlap. Thus, crosses includes, for example, the situation where an outline of a portion of a first qubit on one layer or substrate is projected perpendicularly from that portion, layer or substrate and the projection intersects an outline of a respective portion of a second qubit on another layer or substrate.

The couplers over- or under-lie the bodies of the qubits in quantum processor architecture 800. Herein overlie will be used for convenience of reference, but underlie is possible unless expressly rejected or disavowed by the context. Coupler 814-0 overlies a portion of qubit 802-0 and qubit 804-0. Thus coupler 814 can provide a coupling between qubit 802-0 and qubit 804-0. For a tunable coupler, control interfaces not illustrated in FIG. 8, the coupling between qubit 802-0 and qubit 804-0 is tunable. In some implementations, the coupler 814-0 is fixed (non-tunable). Coupler 816 overlies a portion of qubit 804-0 and qubit 806-0. Coupler 816 can provide a coupling between qubit 804-0 and qubit 806-1. For a tunable coupler, control interfaces not illustrated in FIG. 8, the coupling between qubit 804-0 and qubit 806-0 is tunable. Coupler may have a "x" (cross) shape to match the geometry of the qubits it overlies and/or the shape of the qubits the coupler overlies where the qubits cross.

Figure 9:
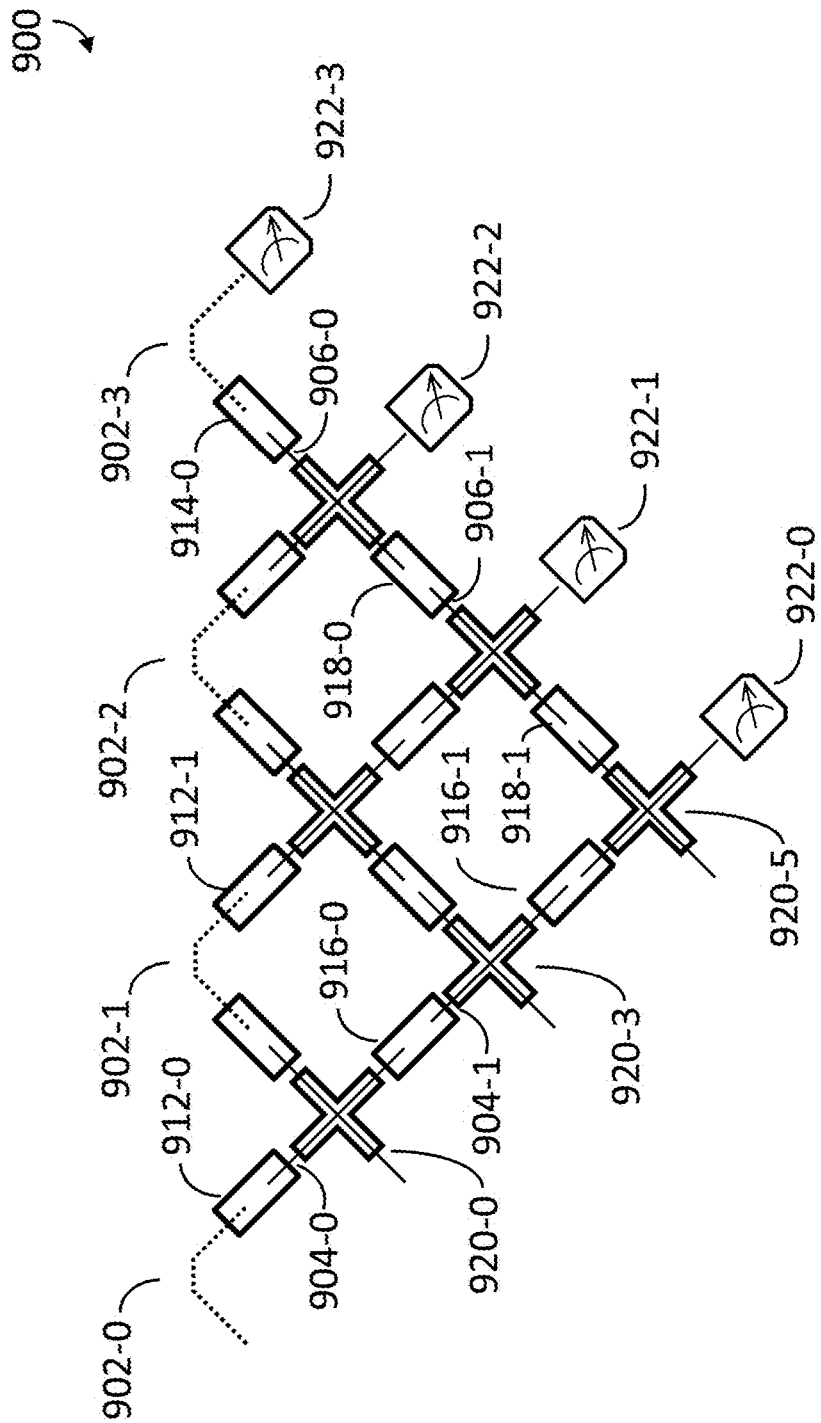
FIG. 9 is a schematic diagram that illustrates a portion of an exemplary quantum processor architecture showing a qubit topology in accordance with the present methods, systems and devices.

FIG. 9 illustrates a portion of a quantum processor architecture 900 in accordance with the present systems and devices. The qubits are generally formed as elongated loops on a horizontal plane (i.e., parallel to the face of the drawing sheet), and extend in a plurality of directions. The couplers over- or under-lie the qubits. The topology of the qubits can be shown by illustrating the arrangements of the couplers.

The quantum processor architecture 900 includes a first plurality of qubits 902-0, 902-1, 902-2, and 902-3 (collectively 902). The qubits 902 include bistable qubits. In some implementations, the quantum processor architecture 900 includes a first interface to control an off-diagonal term to at least one qubit in the qubits 902. In some implementations, the quantum processor architecture 900 includes a second interface to control a diagonal term to at least one qubit in the qubits 902.

The qubits 902 include a first and a second end and may be apical in shape like qubit 802-0 of FIG. 8. As shown, qubits 902 can have a profile of a frustum to lessen the overall length of the qubits to match the length of other qubits in quantum processor architecture 900.

As shown there are four qubits in the qubits 902. The number of qubits can be varied for different implementations.

The quantum processor architecture 900 includes a second plurality of qubits 904-0, and 904-1 (collectively 904) extending generally in a first direction. The quantum processor architecture 900 includes a second plurality of qubits 906-0, and 906-1 (collectively 906) extending generally in a second direction. The first direction and the second direction are such that at least one qubit from the qubits 904 cross at least one qubit in the qubits 906. The qubits 904 and qubits 906 may be monostable qubits. The qubits 904 and qubits 906 may be tri-biased qubits such as shown in FIG. 7. The qubits 902 and qubits 904 can form ladder structures. The qubits 902 and qubits 906 can form ladder structures. For example, two overlapping arrays of ladder elements can be formed. Given the crossing of the qubits 904 and qubits 906 the qubits in qubits 902 can be coupled to each other.

The quantum processor architecture 900 includes a first plurality of couplers (912-0, 912-1, etc. collectively 912) and a second plurality of couplers (914-0, etc. collectively 914). The first plurality of couplers 912 overlie portions of qubits in the qubits 902 and overlie portions of a sub-set of qubits in the qubits 904. A respective coupler in first plurality of couplers 912 overlies a portion of a respective qubit in the qubits 902 at a first end of the respective qubit. A respective coupler in first plurality of couplers 912 overlies a portion of a respective qubit of the subset of qubits in the qubits 904. The first plurality of couplers 912 provides communicative coupling between the qubits 902 and the sub-set of the qubits 904. In some implementations, the sub-set of qubits 904 are found on the leading edge of the second plurality of qubits 904 extending generally in the first direction. The first plurality of couplers 912 may be tunable or non-tunable.

The second plurality of couplers 914 overlie portions of qubits in the qubits 902 and overlie portions of qubits in the third plurality of qubits 906. A respective coupler in second plurality of couplers 914 overlies a portion of a respective qubit in the qubits 902 at a second end of the respective qubit. A respective coupler in second plurality of couplers 914 overlies a portion of a respective qubit of the subset of qubits in the qubits 906. The second plurality of couplers 914 provides communicative coupling between the qubits 902 and a sub-set of the qubits 906. In some implementations, the sub-set of qubits 906 are qubits on the leading edge of the third plurality of qubits 906 extending generally in the second direction. The second plurality of couplers 914 may be tunable or non-tunable.

The quantum processor architecture 900 includes a third plurality of couplers (e.g. 916-0, 916-1, collectively 916) providing communicative coupling amongst the qubits of the second plurality of qubits 904. In some implementations, the third plurality of couplers 916 are fixed. In some implementations, the third plurality of couplers 916 are tunable. An example of a tunable coupler is coupler 210 shown in FIG. 2.

The quantum processor architecture 900 includes a fourth plurality of couplers (e.g. 918-0, 918-1, collectively 918) providing communicative coupling amongst the qubits of the third plurality of qubits 906. In some implementations, the fourth plurality of couplers 918 are fixed. In some implementations, the fourth plurality of couplers 918 are tunable.

The quantum processor architecture 900 includes a fifth plurality of couplers (e.g. 920-0, 920-1, collectively 920) providing controllable communicative coupling between the qubits of the second plurality of qubits 904 and the third plurality of qubits 906. As well, the fifth plurality of couplers 920 provides controllable communicative coupling amongst the qubits of the first plurality of qubits 902 via intervening qubits and couplers. The couplers 920 overlie portions of the qubits from the second plurality of qubits 904 and qubits from the third plurality of qubits 906. As shown the couplers 920 are "+" (plus) shaped but could be "A" (lambda) shaped, or the like, depending on the angle between the first and second direction and other factors.

The fifth plurality of couplers 920 provides a controllable communicative coupling between the qubits of the second plurality of qubits 904 and the third plurality of qubits 906. The communicative coupling in each coupler is controllable via an interface on the coupler. An example of a tunable coupler is coupler 210 shown in FIG. 2.

The quantum processor architecture 900 includes a first plurality of read-out devices (e.g. 922-0, 922-1, collectively 922). The first plurality of read-out devices 922 reads the states of the qubits 904. When the qubits 904 are included in ladder structures with qubits 902, first plurality of read-out devices 922 readout the states of the qubits 902. In some implementations, quantum processor architecture 900 includes a second plurality of read-out devices (not shown) to read the state of states of the qubits 906, and/or qubits 902. In some implementations, the second plurality of read-out devices could be proximate to the end of ladder structures at the ends of the third plurality of qubits 906.

The quantum processor architecture 900 can be described in comparison to other quantum processor architectures. U.S. Pat. No. 8,421,053 describes a quantum processor with qubits laid out into an architecture of unit cells including bipartite graphs, such as, $K_{4,4}$. That is four qubits in one part of a graph and four qubits in the other part of the graph. These unit cells are laid out in a rectangular grid. The quantum processor architecture 900 is a quantum processor with qubits laid out in unit cells including bipartite graphs with one qubit in each part of the graph $K_{1,1}$. The qubits in a first direction are in a first plurality of qubits and the qubits in a second direction are in a second plurality of qubits. The unit cells are laid out in an upper or lower diagonal of a square of unit cells. Along the diagonal "L" (letter L) shaped qubits joining qubits from the first plurality of qubits and the second plurality of qubits.

The quantum processor architecture 900 can be generalized to include bipartite unit cells. Each qubit in the second plurality of qubits 904 is replaced with a first half a bipartite unit cell and each qubit in the third plurality of qubits 906 is replaced with the second half of the bipartite unit cell. The qubits in a representative bipartite unit cell cross. Couplers are place proximate to the crossings and between unit cells. The qubits of the first plurality of qubits 902 could be arranged to mate with a sub-set of the qubits in bipartite unit cells.

Figure 10:
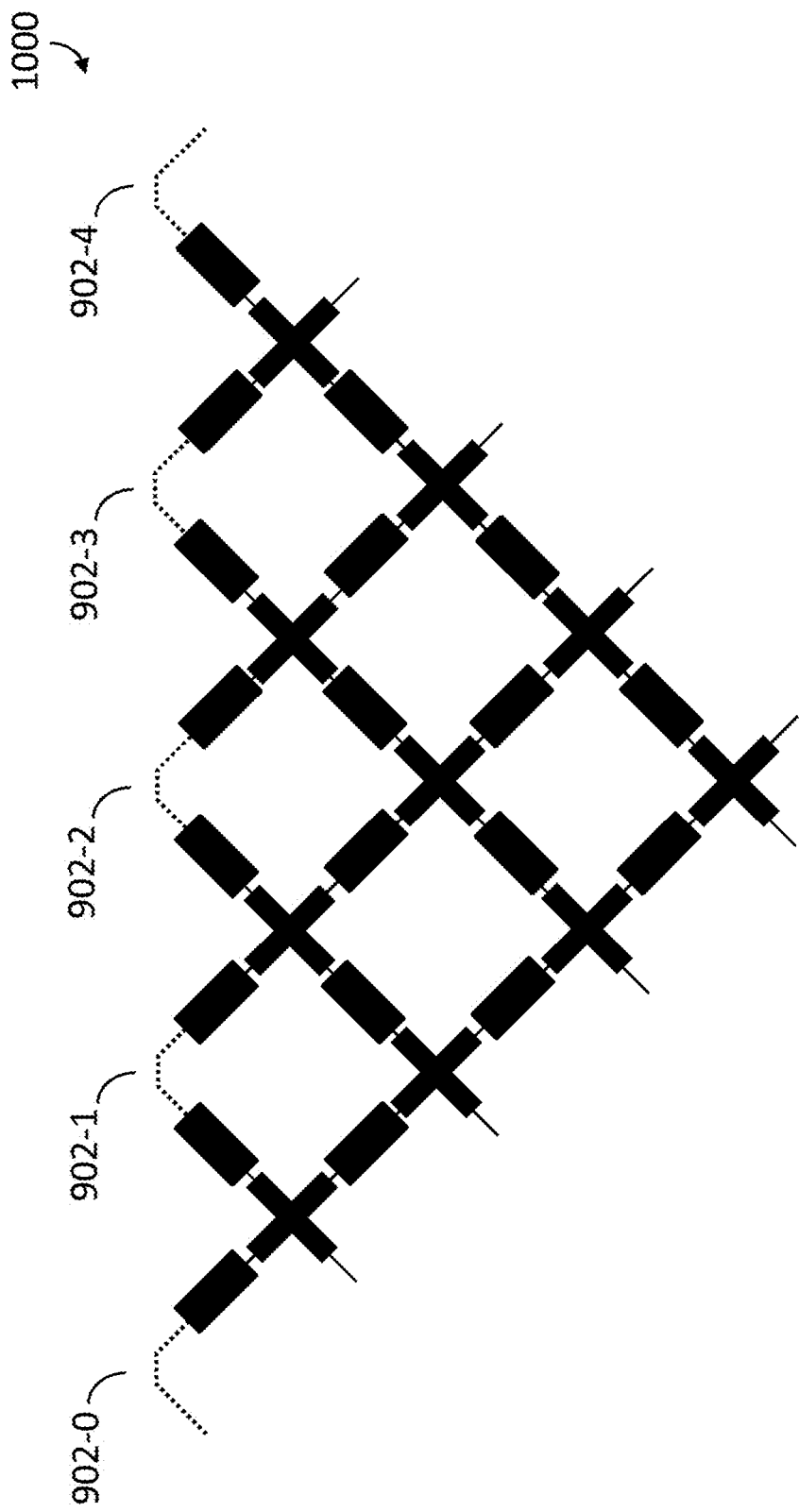
FIG. 10 is a schematic diagram that illustrates a portion of an exemplary quantum processor architecture implementing a complete graph in accordance with the present systems and devices.

FIG. 10 illustrates a portion of a quantum processor architecture 1000 in accordance with the present systems and devices. The quantum processor architecture 1000 includes a first plurality of qubits (e.g. 902-0, 902-1, collectively 902). The first plurality of qubits 902 can be coupled to each other by having a coupling between each qubit in the quantum processor architecture 1000. With five qubits in first plurality of qubits 902, the logical graph formed by the quantum processor architecture 1000 is $K_5$ or complete five. The vertices are the first plurality of qubits 902 and the edges the ladder elements and couplers connecting them. Quantum processor architectures into which both a $K_5$ and a $K_{3,3}$ graph can be embedded have utility in solving certain classes of problems. As shown, a filled in coupler is a non-zero coupling value between qubits.

The quantum processor architectures 900, 1000, and 1100 (below) can form logical qubits from the qubits. These logical qubit have intra-logical qubit couplers and inter-logical qubit couplers. In some implementations, the intra-logical qubit couplers are set at calibration time. In some implementations, the intra-logical qubit couplers are set after calibration and prior to run-time. An example of a coupling value is a ferromagnetic coupling. In some implementations, the coupling value is a strong ferromagnetic coupling. A strong ferromagnetic coupling is a setting on a coupler that is in magnitude greater than a setting on a coupler for an antiferromagnetic coupling. In some implementations, the coupling value has a magnitude of twice the magnitude of the energy of an antiferromagnetic coupling. In some implementations, the coupling value is between 1.5 and 4 times the energy of an antiferromagnetic coupling. Ferromagnetic and antiferromagnetic couplings differ by a sign. In some implementations, the intra-logical qubit couplers are set to a value stronger than the coupler values for the inter-logical qubit couplers. For example, couplers 912, 914, 916, and 918 have a different coupling strength to coupler 920.

Figure 11:
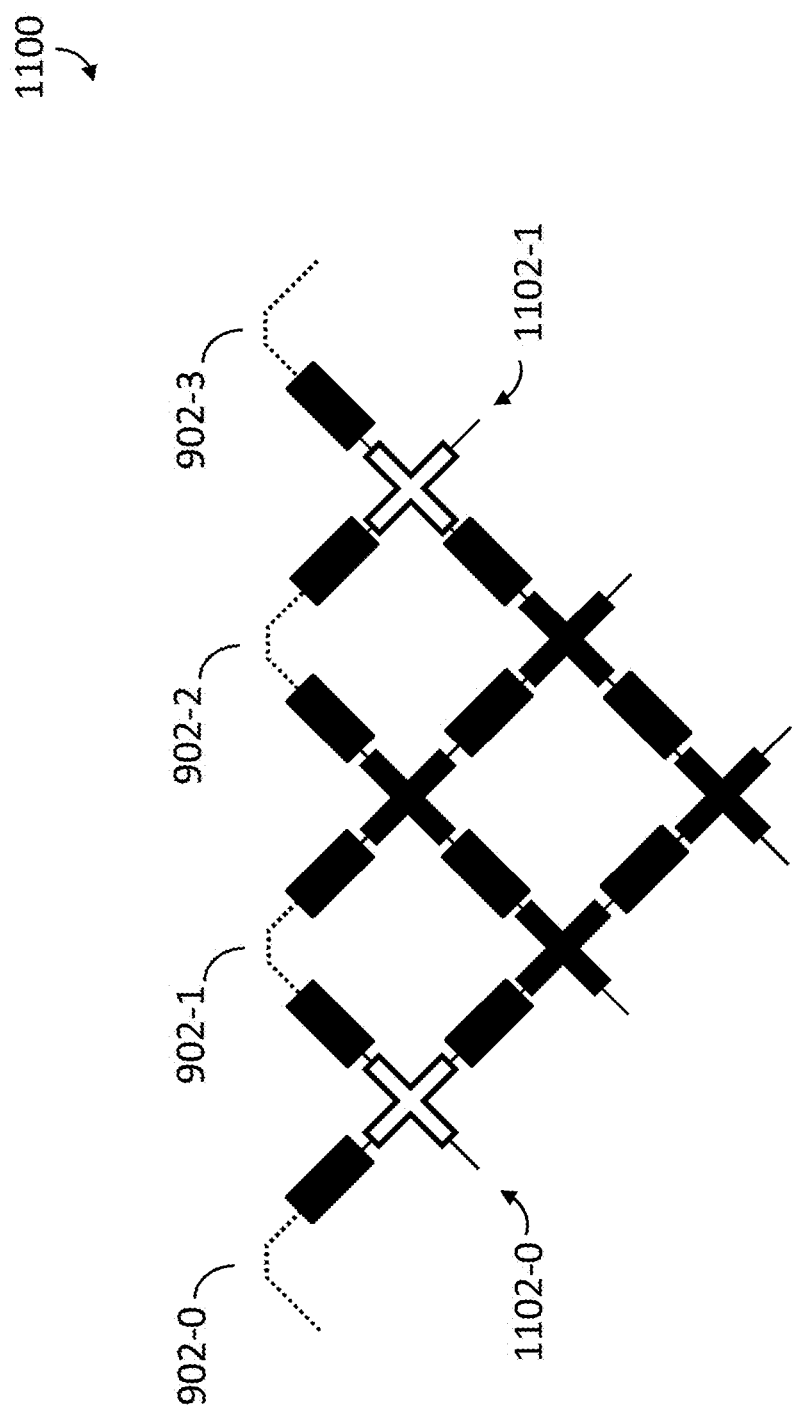
FIG. 11 is a schematic diagram that illustrates a portion of an exemplary quantum processor architecture implementing a bipartite graph in accordance with the present systems and devices.

FIG. 11 illustrates a portion of a quantum processor architecture 1100 in accordance with the present systems and devices. The quantum processor architecture 1100 includes a first plurality of qubits (e.g. 902-0, 902-1, etc. collectively 902). The quantum processor architecture 1100 implements a $K_{2,2}$ graph. That is a bipartite graph with two nodes in each part. (Extensions to $K_{3,3}$ are possible.) In the first part of the graph are qubits 902-0 and 902-1. In the first part of the graph are qubits 902-2 and 902-3. Each qubit in the second part has at least one associated ladder structure. Each qubit in the first part has at least one associated ladder structure. Where a ladder element associated with the first part cross a ladder element associated with the second part the coupler proximate to the crossing is on. Where a ladder element associated with the first part or second part crosses a ladder element associated with the same part coupler proximate to the crossing is off. Thus couplers 1102-0 and 1102-1 are off.

Figure 12:
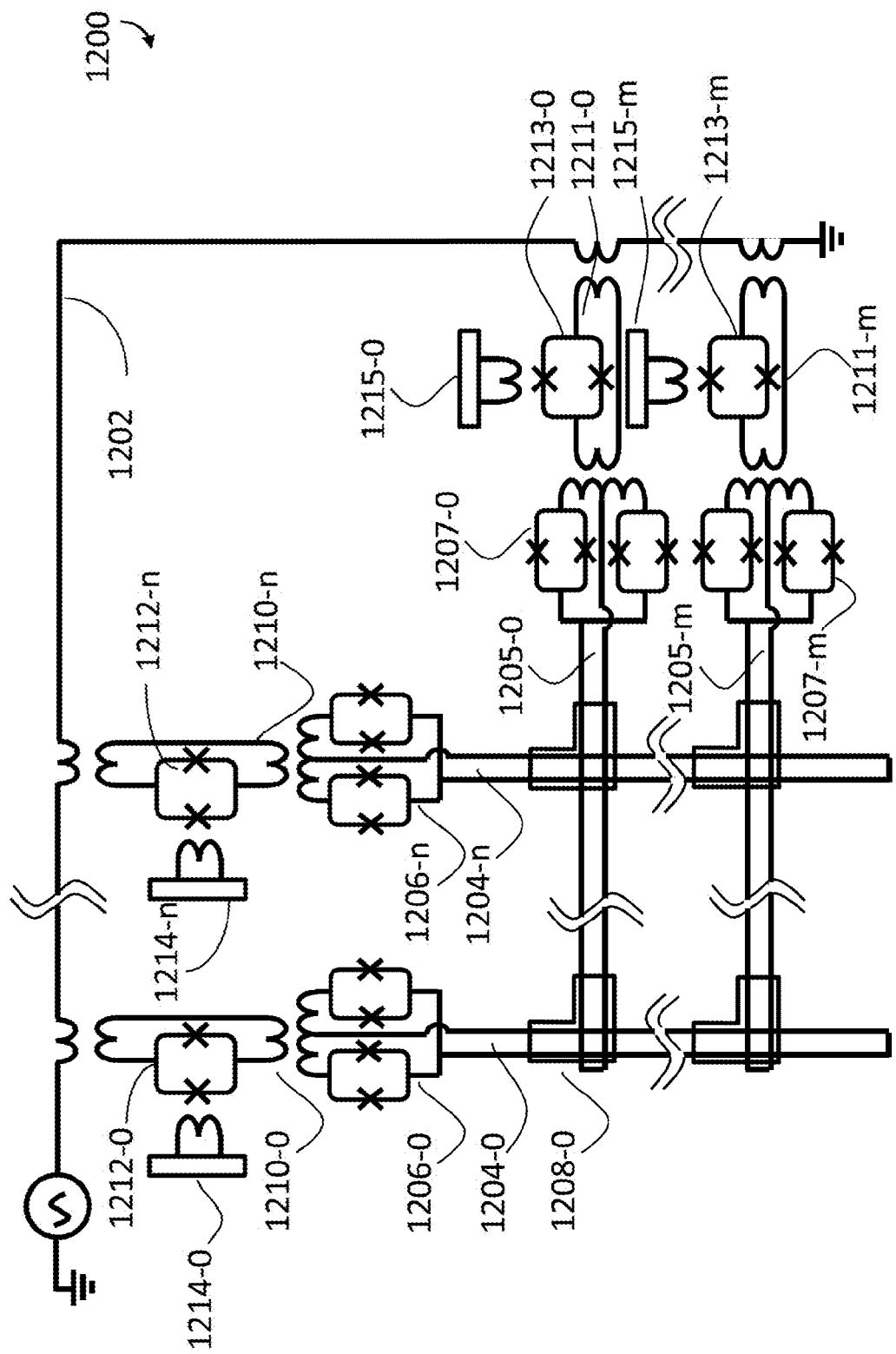
FIG. 12 is a schematic diagram that illustrates a portion of an exemplary quantum processor architecture including tunable couplers between a signal line and a plurality of superconducting devices in accordance with the present systems and devices.

FIG. 12 illustrates a portion of a quantum processor architecture 1200 including tunable couplers between a signal line and a plurality of superconducting devices. The quantum processor architecture includes a signal line 1202. The signal line can be a global line for a quantum processor. The signal line can carry an annealing signal. For a description of annealing signals see US Patent Publication 2011-0060780.

The quantum processor architecture 1200 includes a first plurality of superconducting devices 1204. The plurality includes superconducting devices 1204-0 to 1204-$n$, collectively devices 1204. For example, the superconducting devices could be sequentially number and the plurality of devices could have n devices. Each superconducting device in devices 1204 includes a CCJJ 1206 (e.g. 1206-0 to 1206-$n$).

Each superconducting device in devices 1204 may be communicatively coupled to the signal line 1202 via a respective CCJJ 1206 and a tunable coupler 1210. In FIG. 12 there is a plurality of tunable couplers 1210 (e.g. 1210-0, 1210-$n$ and collectively 1210). A tunable coupler in the plurality of tunable couplers 1210 includes a loop of superconducting material interrupted by at least one compound Josephson junction 1212 (e.g. 1212-0, 1212-$n$ and collectively 1212).

The flux applied to the at least one compound Josephson junction 1212 controls, in part, a communicative coupling between the signal line 1202 and the CCJJ 1206. When the flux in the compound Josephson junction 1212 is tuned, the coupling value is modulated between and including a first coupling value set by mutual inductances between the signal line 1202 and the coupler 1210, and the coupler 1210 and the superconducting device 1204, and a second coupling value, zero coupling. Thus superconducting device 1204 can be coupled or decoupled from signal line 1202.

The quantum processor architecture includes a second plurality of superconducting devices 1205. The second plurality includes superconducting devices 1205-0, 1205-1 (not shown), to 1205-$m$. Each superconducting device includes a CCJJ 1207. The second plurality of superconducting devices 1205 is arranged so at least one device in the second plurality of superconducting devices 1205 crosses at least one device of the first plurality of superconducting devices 1204. Proximate to the cross of devices is a coupler (e.g., 1208-0) to mediate the coupling between a first device in the first plurality of superconducting devices 1204 and a second device in the second plurality of superconducting devices 1205.

Each superconducting device of the second plurality of superconducting devices 1205 is coupled to the signal line 1202 via CCJJ 1207 and a tunable coupler 1211 (e.g. 1211-0, 1211-$m$). A tunable coupling in the plurality of tunable coupling 1211 includes a loop of superconducting material interrupted by at least one compound Josephson junction (e.g. 1213-0, 1213-$m$ and collectively 1213). A tunable coupler in the plurality of tunable couplers 1211 includes a loop of superconducting material interrupted by at least one compound Josephson junction 1213. A coupling value for a coupler in the plurality of tunable couplers 1211 can be modulated between and including a first coupling value and a second coupling value. Thus superconducting devices 1205 can be coupled or decoupled from signal line 1202.

The tunable couplers 1210 and 1211 can be tuned by local (i.e., on-chip with quantum processor 200) control circuitry. In some implementations, the local circuitry is complemented with or replaced by a pre-bias line. Each tunable couplers 1210 and 1211 could be associated with a pre-bias line(s). (Not shown to reduce clutter.) Examples of on-chip control circuitry include digital to analog converters (DACs). In some implementations, the quantum processor architecture 1200 includes DACs 1214 (e.g. 1214-0, 1214-$n$) proximate to compound Josephson junctions 1212 (e.g. 1212-0, 1212-$n$). In some implementations, the quantum processor architecture 1200 includes DACs 1215 (e.g. 1215-0, 1215-$m$) proximate to compound Josephson junctions 1213. DACs includes those described in, for example, U.S. Pat. Nos. 7,876,248; and 8,035,540.

Figure 13:
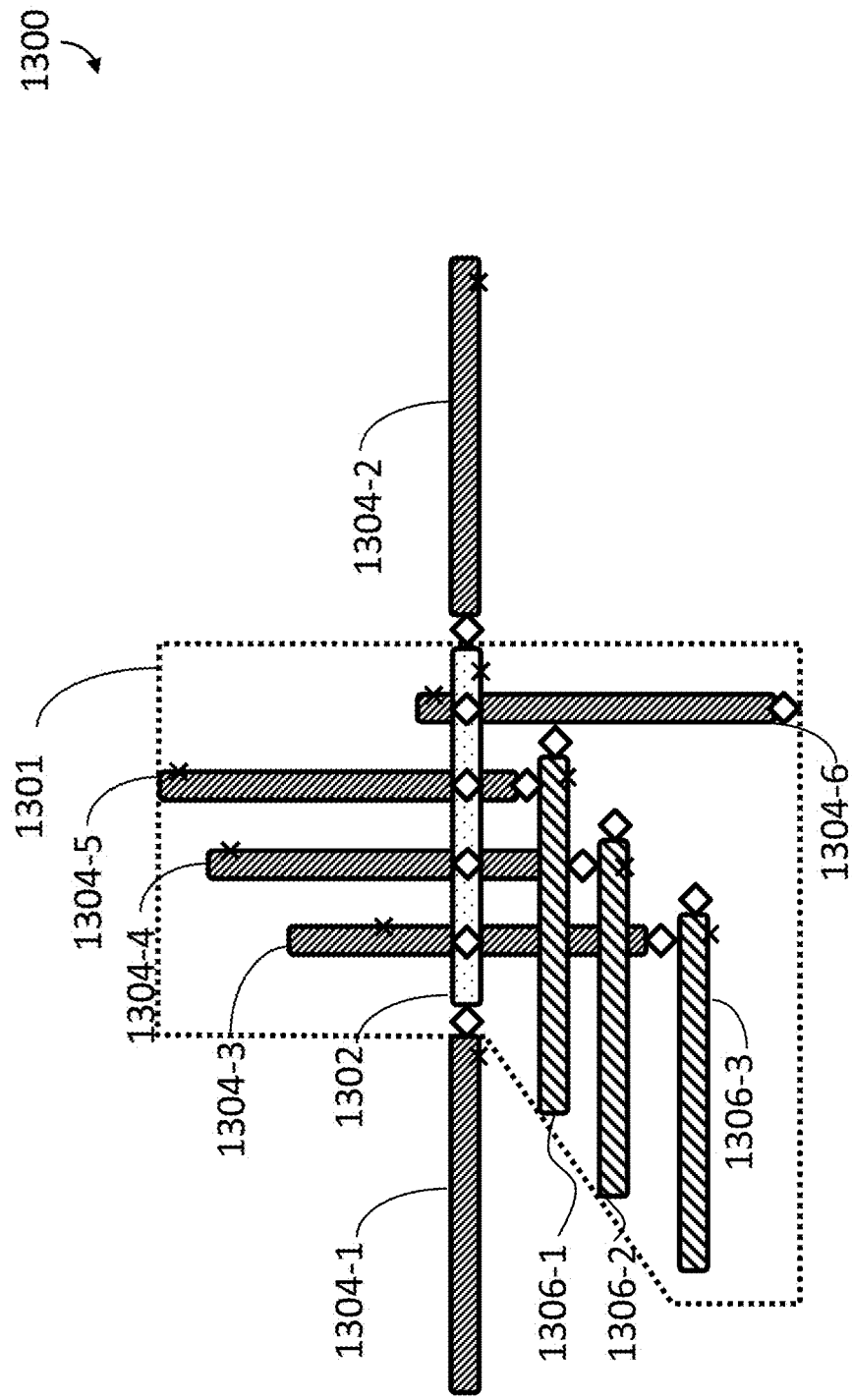
FIG. 13 is a schematic diagram that shows an exemplary unit cell forming the basis of a quantum processor architecture in accordance with the present systems and devices.

FIG. 13 shows an exemplary portion of a quantum processor 1300 including a unit cell 1301 forming the basis of a quantum processor architecture in accordance with the present systems and devices. Quantum processor architectures may employ unit cells tiled over an area. A unit cell may include first set of qubits and second sets of qubits where each qubit in the first set crosses at least one qubit in the second set. Each unit cell is positioned proximally adjacent at least one other unit cell. Within each unit cell, at least one qubit may longitudinally shifted with respect to at least one other qubit such that the longitudinally-shifted qubit crosses at least one qubit in a proximally adjacent unit cell. Communicative coupling between qubits is realized through respective intra-cell and inter-cell couplers. See US Patent Application Publication 2014-0097405.

Unit cell 1301 includes qubits 1302, 1306-1, 1306-2, and 1306-3 which are laid out horizontally in FIG. 13 and qubits 1304-3, 1304-4, 1304-5, and 1304-6, which are laid out vertically in FIG. 13. Qubits 1304-1 and 1304-2 are not part of unit cell 1301 but neighbors to qubit 1302. Collectively these qubits are labeled 1302, 1304, and 1306. The role of qubits 1304-1 and 1304-2 is illustrated and described in FIG. 14 below. As previously described, unit cell 1301 represents a single unit cell in a quantum processor, whereas the corresponding quantum processor architecture may comprise a plurality of unit cells 1301 tiled over an area. A complete processor architecture may employ multiple unit cells 1301, with each individual unit cell 1300 being positioned adjacent (i.e., neighboring) at least one other unit cell 1300. A person of skill in the art will appreciate that while six qubits are illustrated in unit cell 1301, this number is arbitrary and unit cell 1301 may comprise more or fewer than six qubits (but must comprise at least two qubits).

Qubits 1302, 1304, and 1306 may be superconducting qubits. Each qubit 1302, 1304, and 1306 may be a respective loop of superconducting material elongated along a respective longitudinal axis (major axis) and interrupted by at least one respective Josephson junction. Each of horizontal qubits 1302, 1306-1, 1306-2, and 1306-3 are laid out substantially parallel to one another and each of vertical qubits 1304-3, 1304-4, 1304-5, and 1304-6 are laid out substantially parallel to one another. Parallel can be defined with respect to a longitudinal axis. Where the longitudinal axis is not a straight line, parallel may be defined as if one qubit where shifted perpendicularly with respect to another qubit as sufficient distance, the loops of the two qubits would coincide or overlap with one another about the entire path of the loops. This would apply whether the loop were elliptical, or polygonal or had some other geometric shape or form. The vertical qubits are substantially perpendicular to the horizontal qubits. With respect to a more conventional unit cell some of the qubits in the unit cell 1301 are longitudinally shifted with respect to at least one other qubit.

The qubit 1302 has six (6) nearest neighbors qubits 1304-1 to 1304-6. Some of these are outside of the unit cell 1301. The qubit 1302 has more next-nearest neighbors qubits including 1306-1 to 1306-3 and others not shown here but shown in FIG. 14. For ease of recognition in the drawing, qubit 1302 is illustrated with a first fill pattern. Also for ease of recognition in the drawing, nearest neighbors qubits are illustrated with a second fill pattern and the next-nearest neighbors qubits are illustrated a third fill pattern. All fill patterns are reused in FIG. 14 with same meaning.

Figure 14:
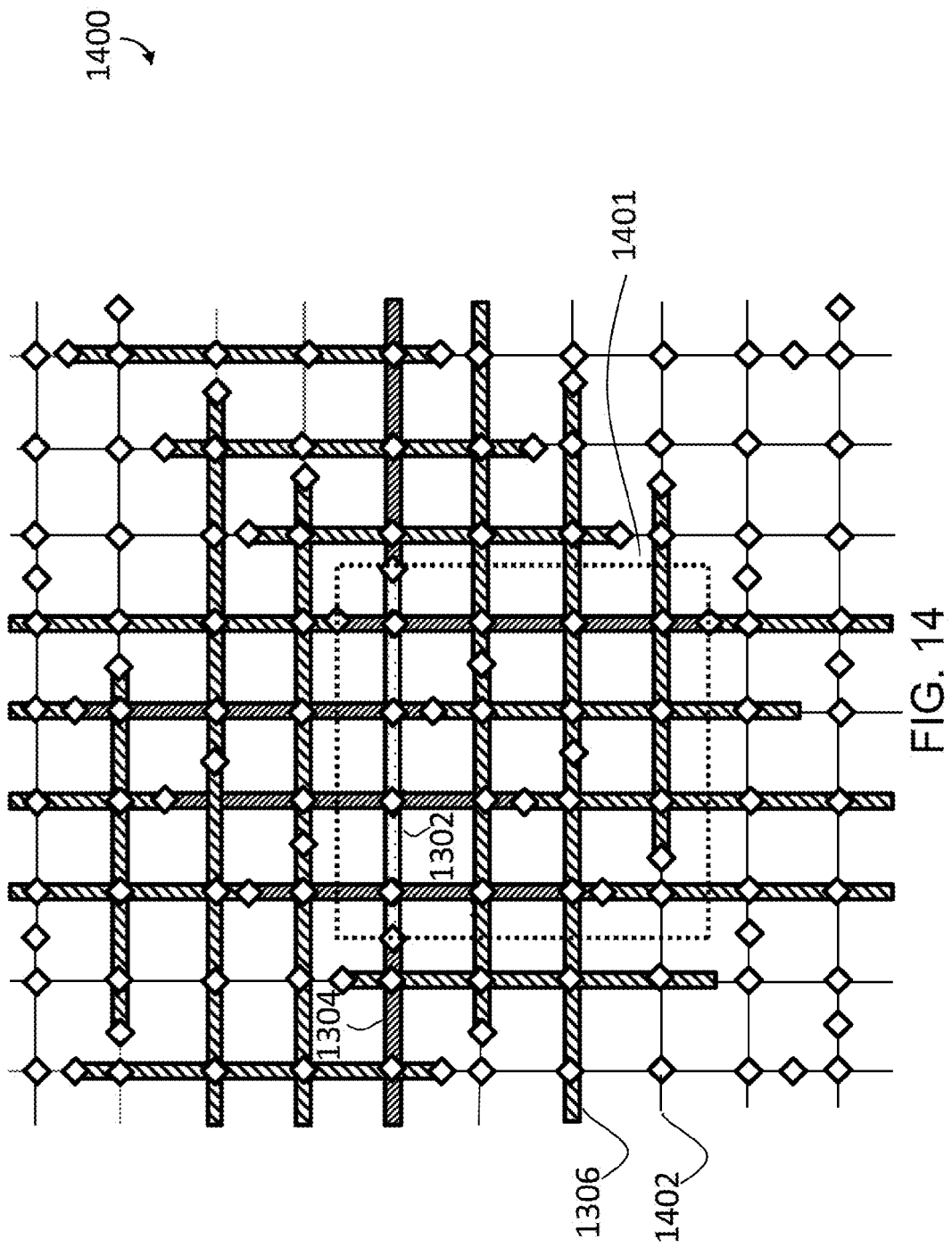
FIG. 14 is a schematic diagram that shows an exemplary a quantum processor architecture, including the unit cell forming from FIG. 13, in accordance with the present systems and devices.

FIG. 14 shows an exemplary quantum processor architecture 1400, including the unit cell forming from FIG. 13, in accordance with the present systems and devices. The qubit 1302 has six (6) nearest neighbors, qubits 1304.

The qubit 1302 has twenty-eight (28) next-nearest neighbors qubits, such as qubit 1306 (only one qubit called out but sharing the same interior fill pattern). There are other qubits in quantum processor architecture 1400 and these are further away, as measure by intervening couplers or hops, from qubit 1302. For example, qubit 1402 is three (3) hops away from qubit 1302. When the qubits 1304 are operated as ladder elements, or couplers, then the qubit 1302 has a connectivity of twenty-eight (28). That is the logical connectivity of a qubit in quantum processor architecture 1400 is twenty-eight (28) compared to the physical connectivity of six (6).

A hybrid computer may operate a qubit, such as qubits 1304, as couplers or ladder elements by suppressing the normalized inductance of the qubit. For example, by biasing a CCJJ in the qubit as described above in FIG. 7.

An alternative definition of a unit cell exists. A unit cell can be a repeatable portion of a tiling and the boundaries of the portion can cross couplers or qubits or other device in the tiling. An example of such a unit cell is unit cell 1401.

Figure 15:
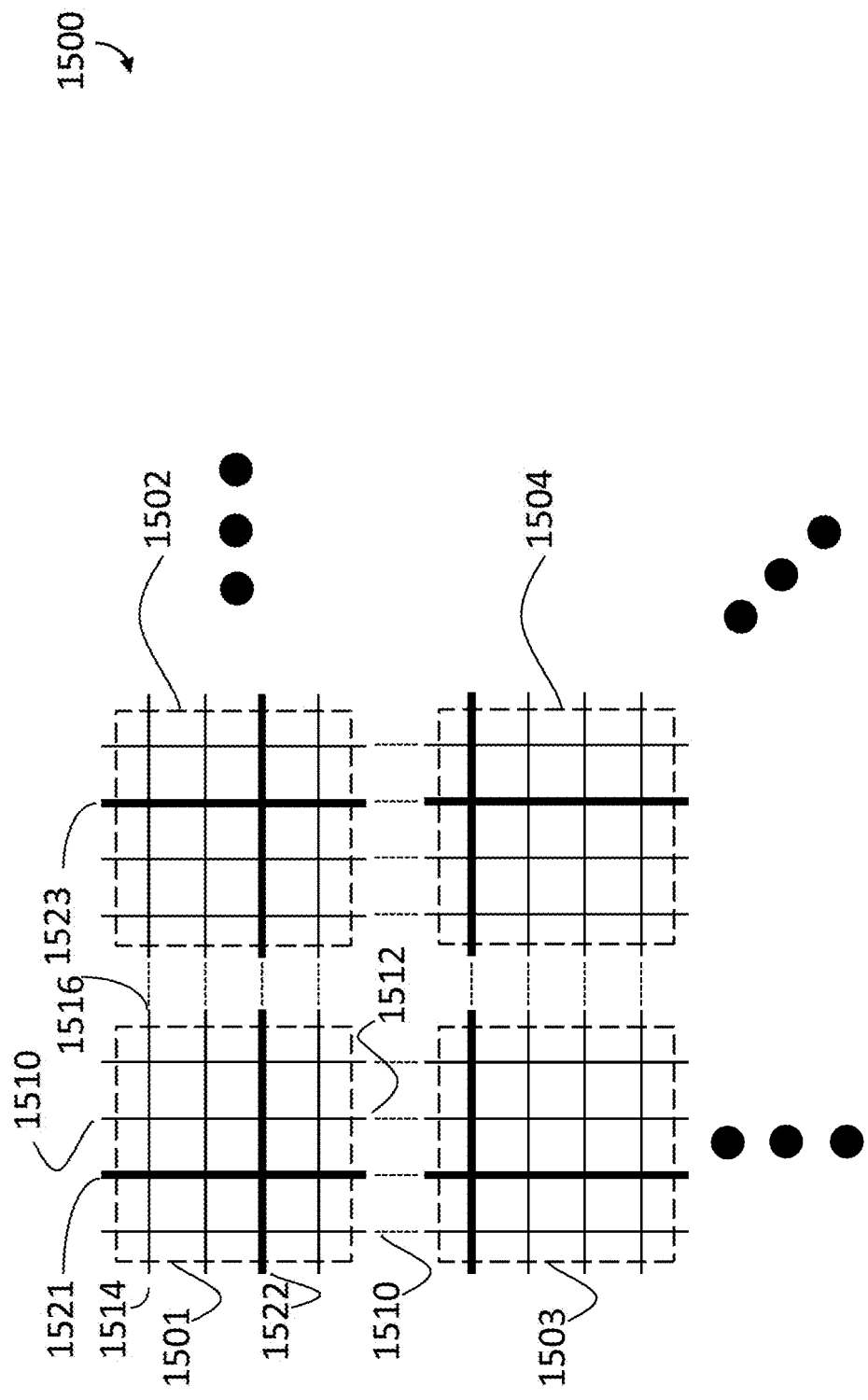
FIG. 15 is a schematic diagram of a quantum processor architecture illustrating the interconnections realized between the unit cells in the quantum including devices like couplers, in accordance with the present systems and devices.

FIG. 15 is a schematic diagram of quantum processor architecture 1500, illustrating the interconnections or communicative couplings realized between the unit cells in a quantum processor architecture, such as quantum processor architecture 1200 from FIG. 1200, in accordance with the present systems and devices. Architecture 1500 comprises unit cells 1501, 1502, 1503, and 1504, each illustrated in FIG. 15 as a stippled square including solid line extensions. The solid lines extending out from each stippled square represent portions of superconducting devices, such as, qubits or couplers, in the unit cell located closest to the periphery of the unit cell. For example, portions 1510 and 1512 represent portions of a first device of a first set of superconducting devices. Portions 1514 and 1516 represent portions of a second of a second set of superconducting devices.

Only unit cells 1501, 1502, 1503, and 1504 are called out in FIG. 15 to reduce clutter. The number of solid lines extending out from each stippled square is shown even for the horizontal and vertical directions. In some implementations, the number of solid lines extending vertically differs from the number of lines extending horizontally. Each unit cell 1501, 1502, 1503, and 1504 may contain a superconducting device such as qubit 700 from FIG. 7. Intra-cell couplers are not shown in FIG. 15 to reduce clutter.

The broken lines in FIG. 15, such as coupler 1510, represent inter-cell couplers that may be established between devices in adjacent unit cells by inter-cell couplers. Inter-cell couplings may be established between horizontally adjacent unit cells, and/or vertically adjacent unit cells.

As illustrated, unit cell 1501 is positioned immediately next to unit cell 1502 in a horizontal direction with no other unit cells in between, thereby making unit cells 1501 and 1502 horizontally adjacent. Unit cell 1501 is positioned immediately next to unit cell 1503 in a vertical direction with no other unit cells in between, thereby making unit cells 1501 and 1503 vertically adjacent. As shown in quantum processor architecture 1500, a unit cell may interact with up to four other unit cells placed horizontally adjacent, and vertically adjacent by inter-cell coupling, except for those unit cells located at the peripheries of quantum processor architecture 1500, which may have fewer adjacent unit cells. Those of skill in the art will appreciate that this assignment of vertical, and horizontal directions is arbitrary, used as a convenient notation, and not intended to limit the scope of the present systems and devices in any way.

Respective devices of two horizontally adjacent unit cells may be directly communicatively coupled via a respective single coupler. Respective devices of two vertically adjacent unit cells may be directly communicatively coupled via a respective single inter-cell coupler.

A respective qubit in a unit cell may include tunable superconducting devices such as qubit 700 from FIG. 7. The tunable superconducting would be located at the solid lines extending from the unit cells. A unit cell could include one vertical device operated as a coupler. For example, device 1521 in unit cell 1501 is an example of a device operated as a coupler. As shown, all bold lines indicated devices operated as couplers.

Each tunable superconducting device could be operated as a qubit or as a coupler. For example, a plurality of unit cells arranged in a column could each include one vertical device operated as a coupler. If arranged vertically adjacent to each other these couplers could form a vertical ladder. A plurality of unit cells arranged in a row could each include one horizontal device operated as a coupler. If arranged horizontally adjacent to each other these couplers could form a horizontal ladder. Ladders extending across all or a portion of a processor have utility in embedding problems.

As observed across a plurality of columns, the devices operated as couplers need not occupy the same relative position in a unit cell. For example, devices 1521 and 1523 are operated as couplers but are in different relative positions in their respective unit cell. As observed across a plurality of rows the devices operated as coupler need not occupy the same relative position in a unit cell.

Figure 16:
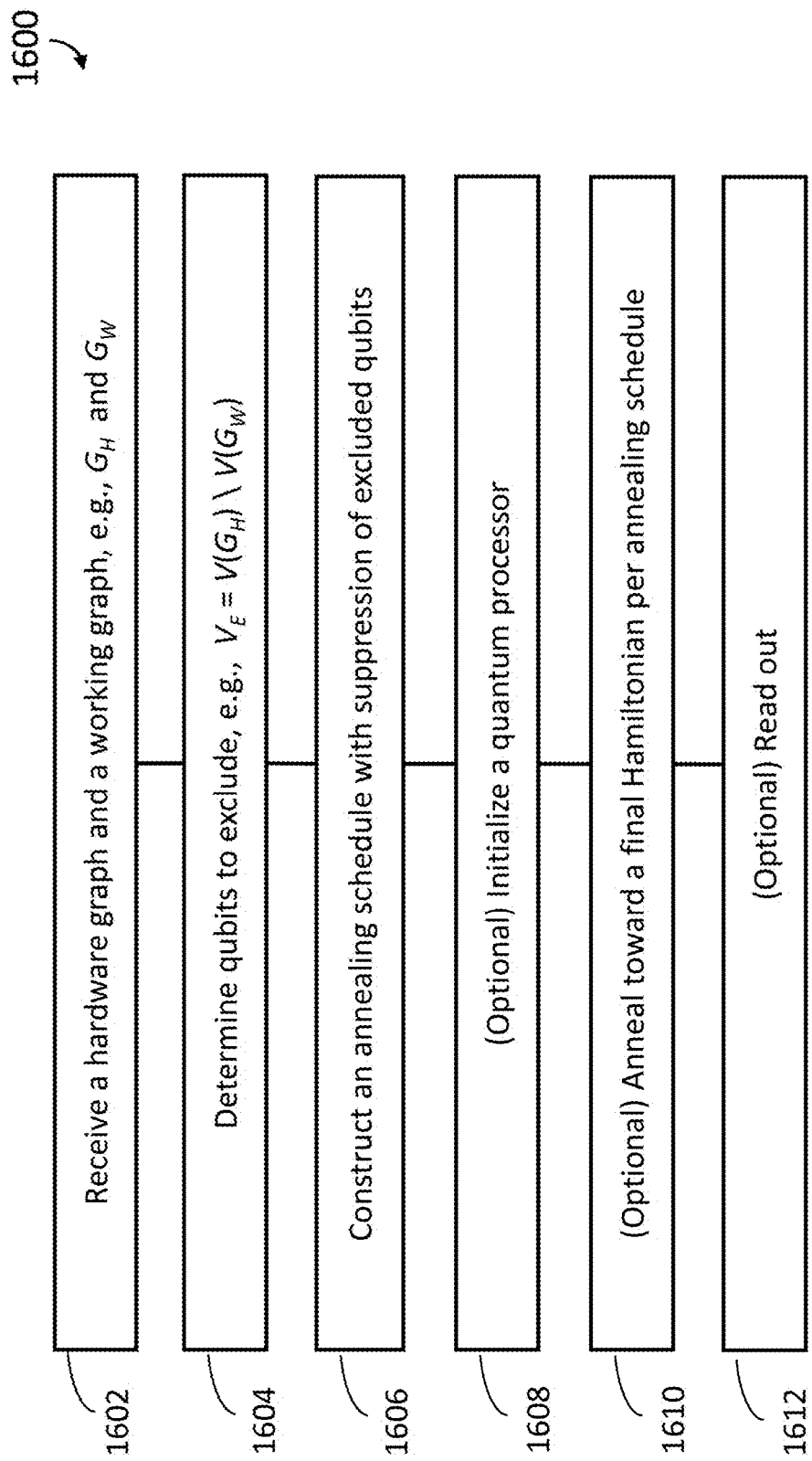
FIG. 16 is a flow diagram that shows an exemplary method for preparing an annealing schedule based on a working graph in accordance with the present systems and devices.

FIG. 16 shows an exemplary method 1600 for preparing an annealing schedule based on a working graph in accordance with the present systems and devices. In some implementations, method 1600 is performed by a machine running the set of computer- or processor-readable connectivity instructions 139 of FIG. 1. The method can be performed by quantum computer controller, a processor based device. In some implementations, the method is performed by hybrid computer. This example is used in the description of the method.

At 1602, the hybrid computer receives a hardware graph and a working graph. The hardware graph can be denoted $G_H$ and the working graph can be denoted $G_W$. In the hardware graph there are representations of a first plurality of qubits and some of the qubits are directly communicatively coupleable to one another via couplers, without intervening qubits. In the working graph there are representations of a second plurality of qubits and some of the qubits are directly communicatively coupleable to one another via couplers, without intervening qubits. The second plurality of qubits is fewer in number than the first plurality of qubits.

At 1604, the hybrid computer determines a set of qubits to exclude from annealing. For example, the hybrid computer finds the set different between the vertices of the hardware graph and the vertices of the working graph. This can be expressed as $V_E=V(G_H)\backslash V(G_w)$ where V( ) is an operator that extracts the vertices from a graph and \ is the set difference operator.

At 1606, the hybrid computer constructs an annealing schedule for the quantum processor including suppression of the set of qubits to exclude, or excluded qubits. The hybrid computer can suppress the excluded qubits by one or more techniques including setting the incident couplers on the excluded qubit to have a zero coupling value and/or hard bias the excluded qubit to a known state and/or lower the normalized inductance of the excluded qubits or alternatively raise the normalized inductance of the excluded qubits and/or decouple the excluded qubits from an annealing signal.

In some implementations, hybrid computer creates an annealing schedule that suppresses the excluded qubits by setting the incident couplers on the excluded qubits to a zero coupling value. As such, the excluded qubits are decoupled form the remaining qubits in the working graph. However, if couplers have some imprecision in the zero coupling value due to, for example, intrinsic control error, there may a leaked signal from the excluded qubits to the working graph. There may be a communicative coupling through one the excluded qubits. Thus setting the incident couplers on the excluded qubits to a zero coupling value may be combined with another suppression technique.

In some implementations, hybrid computer creates an annealing schedule that suppresses the excluded qubits by biasing the excluded qubits to a known state. For, example the hybrid computer biases all the excluded qubits down by applying a strong local magnetic field to each excluded qubit.

In some implementations, hybrid computer creates an annealing schedule that suppresses the excluded qubits by lowering the normalized inductance of the excluded qubits. In some implementations, hybrid computer lowers the normalized inductance of the excluded qubit to that of a ladder element. That is, less than about equal to one, or $\beta<1$ and $\ge\approx 1$. In some implementations, hybrid computer lowers the normalized inductance of the qubit to a low value. That is, $\beta<<1$.

In some implementations, hybrid computer creates an annealing schedule that suppresses the excluded qubits by raising the normalized inductance of the excluded qubits. The raising of the normalized inductance of the excluded qubits allows the qubit to be frozen out of its dynamical regime. A qubit as it is annealed becomes less dynamical and at some point freezes out. Thus the qubits to be excluded could be given an advanced annealing schedule to free out sooner. In some implementations, hybrid computer raises the normalized inductance of the excluded qubit to higher than that of the qubits in the working graph. That is, greater than one, or $\beta>1$.

In some implementations, hybrid computer creates an annealing schedule that suppresses the excluded qubits by decoupling the excluded qubits from an annealing signal. Example of methods and devices to decouple a qubit from an annealing signal are described in FIGS. 7 and 12. In some implementations, hybrid computer sets a tunable coupler between an annealing line and a qubit to a low coupling value. For example, by setting on-chip control circuitry 1214 (or 1215) of FIG. 12 then an associated coupler in couplers 1210 (or 1211) will have a low coupling value and the associated qubit can be excluded from the annealing process.

In creating an annealing schedule that suppresses the excluded qubits the hybrid computer has imposed a connectivity on a quantum processor. The imposed logical connectivity is different from the physical connectivity as manufactured.

Acts 1608, 1610, and 1612 are optional. The hybrid computer can return the annealing schedule for use by another computer or later use by the same hybrid computer. The acts of storing and/or returning can occur in place of, or in addition to, acts 1608, 1610, and 1612.

At 1608, the hybrid computer establishes an evolution Hamiltonian on a quantum processor. An example of a quantum processor is a superconducting quantum processor, such as, shown in FIG. 2. In some implementations, the evolution Hamiltonian includes as a principal portion an initial Hamiltonian. In some implementations, the evolution Hamiltonian includes a delocalization component. See Equation (5) for an example of a delocalization component. An example of an evolution Hamiltonian is described by Equation (4). It includes a delocalization Hamiltonian and problem Hamiltonian with time varying coefficients. In some implementations, the hybrid computer uses a programming sub-system to establish an evolution Hamiltonian on a quantum processor.

At 1610, the hybrid computer causes the quantum processor to be annealed towards a final state associated with a problem Hamiltonian. In some implementations, an evolution sub-system is used to gradually remove the delocalization terms in the evolution Hamiltonian. For example, for a superconducting flux qubits, the hybrid computer raises the height of barriers between the potential wells in the energy profiles of the qubits. The raising of barriers suppresses quantum tunneling a source of delocalization. As the hybrid computer causes the quantum processor to be annealed towards the final state the influence of the delocalization Hamiltonian relative to the influence of the problem Hamiltonian declines. In some implementations, a plurality of local bias value and coupling values defining the problem Hamiltonian are slowly applied to the quantum processor. In some implementations, the plurality of local bias values and coupling values are present and the magnitude of the delocalization terms, relative to the plurality of local bias value and coupling values, are decreased.

At 1610, the hybrid computer causes the quantum processor to be annealed towards the final state associated with the problem Hamiltonian in accordance with the annealing schedule. The annealing schedule includes information directing how the excluded qubits are to be suppressed. The hybrid computer can suppress the excluded qubits by setting the incident couplers on the excluded qubits to a zero coupling value. Additionally or alternatively, the hybrid computer can hard bias the excluded qubits to a known state. Alternatively or additionally, the hybrid computer can lower the normalized inductance of the excluded qubits. The hybrid computer can decouple the excluded qubits from the annealing signal.

At 1612, the hybrid computer measures the state of the quantum processor. In some implementations, this may involve reading out the state of all or a portion of the qubits in the hardware graph or working by, for example, a readout subsystem. In some examples, the readout subsystems uses one or more DC-SQUIDs to measure the persistent current state of each qubit. Further descriptions of systems, devices, methods, and articles for qubit readout are described in U.S. Pat. Nos. 7,639,035; 8,169,231; and 8,854,074.

The above description of illustrated embodiments and implementations, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other analog processors, not necessarily the exemplary quantum processors generally described above.

The various embodiments described above can be combined to provide further embodiments. To the extent that they are not inconsistent with the specific teachings and definitions herein, all of the U.S. patents, U.S. patent application publications, U.S. patent applications, referred to in this specification and/or listed in the Application Data Sheet, including U.S. provisional application Ser. No. 61/983,370, filed Apr. 23, 2015, are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description.13 In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A quantum processor comprising:
a first superconducting flux qubit including a first coupling portion and a first switch in parallel with the first coupling portion of the first superconducting flux qubit;
a second superconducting flux qubit including a second coupling portion and a second switch in parallel with the second coupling portion of the second superconducting flux qubit;
a coupler including:
a first coupling portion;
a second coupling portion;
a third switch in parallel with the first coupling portion of the coupler, and the first coupling portion of the coupler is arranged with respect to the first coupling portion of the first superconducting flux qubit to effect a magnetic coupling between the first superconducting flux qubit and the coupler,
a fourth switch in parallel with the second coupling portion of the coupler, and the second coupling portion of the coupler is arranged with respect to the second coupling portion of the second superconducting flux qubit to effect a magnetic coupling between the second superconducting flux qubit and the coupler; and
a first interface to control the first switch, the second switch, the third switch, and the fourth switch to couple the first superconducting flux qubit with the second superconducting flux qubit via the coupler.

2. The quantum processor of claim 1 wherein the inductance of the coupler is less than the inductance of the first superconducting flux qubit.

3. The quantum processor of claim 2 wherein the coupler is monostable, the first superconducting flux qubit is bistable, and the second superconducting flux qubit is bistable.

4. The quantum processor of claim 1 wherein the superconducting flux qubit comprises a loop of superconducting material interrupted by at least one compound Josephson junction.

5. The quantum processor of claim 1 wherein the coupler comprises a loop of superconducting material interrupted by at least one Josephson junction.

6. The quantum processor of claim 1 wherein one of the first switch, the second switch, the third switch, or the fourth switch is a compound Josephson junction.

7. The quantum processor of claim 1 further comprising:
a second interface to control an off-diagonal term in the first superconducting flux qubit; and
a third interface to control a diagonal term in the first superconducting flux qubit.

8. The quantum processor of claim 7 further comprising:
a fourth interface to control a normalized inductance of the superconducting flux qubit.

9. The quantum processor of claim 1 further comprising:
an array of superconducting flux qubits including the first superconducting flux qubit, and the second superconducting flux qubit; and
an array of couplers including the coupler.

10. A quantum processor comprising:
an array of superconducting flux qubits, wherein a respective qubit in the array of superconducting flux qubits includes a loop of superconducting metal interrupted by one or more Josephson junctions, including a first coupling portion, and a first switch in parallel with the first coupling portion of the respective qubit;
an array of couplers, wherein a respective coupler includes a loop of superconducting metal including a second coupling portion, and a second switch in parallel with the second coupling portion of the respective coupler, and the second coupling portion of the coupler is arranged with respect to the first coupling portion of the respective qubit in the array of superconducting flux qubits to effect a magnetic coupling;
a first interface to control an off-diagonal term to at least one qubit in the array of superconducting flux qubits;
a second interface to control a diagonal term to at least one qubit in the array of superconducting flux qubits; and
a third interface to control the first switch and the second switch to couple at least one qubit in the array of superconducting flux qubits with at least one coupler in the array of couplers.

11. The quantum processor of claim 10 wherein the inductance of the respective coupler in the array of couplers is less than the respective qubit in the array of superconducting flux qubits.

12. The quantum processor of claim 11 wherein the respective coupler in the array of couplers is monostable and the respective qubit in the array of superconducting flux qubits is bistable.

13. The quantum processor of claim 10 wherein the respective coupler includes a third coupling portion and a third switch in parallel with the third coupling portion of the respective coupler.

14. The quantum processor of claim 13 further comprising a second respective qubit in the array of superconducting flux qubits wherein the second respective qubit in the array of superconducting flux qubits includes a fourth coupling portion and a loop of superconducting metal interrupted by one or more Josephson junctions, a fourth switch in parallel with the fourth coupling portion of the second respective qubit, wherein the fourth coupling portion of the second respective qubit is arranged with respect to the third coupling portion of the couplers to effect a magnetic coupling.

15. The quantum processor of claim 10 wherein one of the first switch and the second switch is a compound Josephson junction.

16. The quantum processor of claim 14 wherein one of the first switch the second switch, the third switch, or the fourth switch is a compound Josephson junction.

17. The quantum processor of claim 10 wherein the total number of couplers in the array of couplers is defined by a linear relationship to the total number of qubits in the array of superconducting flux qubits.

18. The quantum processor of claim 10 further comprising a fourth interface for the array of superconducting flux qubits, to control a normalized inductance of at least one respective superconducting flux qubits in the array of superconducting flux qubits.

19. A quantum processor comprising:
  a first plurality of superconducting flux qubits, wherein a respective qubit in the first plurality of superconducting flux qubits includes a loop of superconducting metal interrupted by one or more Josephson junctions;
  a second plurality of superconducting flux qubits, wherein a respective qubit in the second plurality of superconducting flux qubits includes a loop of superconducting metal interrupted by one or more Josephson junctions, and extends in a first direction;
  a third plurality of superconducting flux qubits, wherein a respective qubit in the third plurality of superconducting flux qubits includes a loop of superconducting metal interrupted by one or more Josephson junctions, and extends in a second direction, wherein at least one superconducting flux qubit of the second plurality of superconducting flux qubits cross at least one superconducting flux qubit of the third plurality of superconducting flux qubits;
  a first plurality of couplers that provide communicative coupling between the first plurality of superconducting flux qubits and a sub-set of the second plurality of superconducting flux qubits;
  a second plurality of couplers that provide communicative coupling between the first plurality of superconducting flux qubits and a sub-set of the third plurality of superconducting flux qubits;
  a third plurality of couplers that provide communicative coupling amongst the superconducting flux qubits of the second plurality of superconducting flux qubits;
  a fourth plurality of couplers that provide communicative coupling amongst the superconducting flux qubits of the third plurality of superconducting flux qubits; and
  a fifth plurality of couplers that provide controllable communicative coupling between the superconducting flux qubits of the second plurality of superconducting flux qubits, and the second plurality of superconducting flux qubits.

20. The quantum processor of claim 19 wherein the second plurality of superconducting flux qubits and the third plurality of superconducting flux qubits are monostable.

21. The quantum processor of claim 19 wherein the second plurality of superconducting flux qubits and the third plurality of superconducting flux qubits are tri-biased qubits.

22. The quantum processor of claim 20 wherein each superconducting flux qubit in the second plurality of superconducting flux qubits and the third plurality of superconducting flux qubits includes a compound compound Josephson junction and is biased by a centered bias, a symmetric bias, or an asymmetrical bias.

23. The quantum processor of claim 19 wherein the first plurality of superconducting flux qubits are bistable.

24. The quantum processor of claim 19 wherein the first plurality of couplers, the second plurality of couplers, the third plurality of couplers, and the fourth plurality of couplers are fixed couplers.

25. The quantum processor of claim 19 wherein the first plurality of couplers, the second plurality of couplers, the third plurality of couplers, and the fourth plurality of couplers are tunable couplers.

26. The quantum processor of claim 19 further comprising a first plurality of read out devices, wherein each read out device is connected to a qubit in the second plurality of superconducting flux qubits.

27. The quantum processor of claim 26 further comprising a second plurality of read out devices, wherein each read out device is connected to a qubit in the third plurality of superconducting flux qubits.

28. The quantum processor of claim 19 further comprising:
  a first interface to control an off-diagonal term for at least one qubit in the first plurality of superconducting flux qubits;
  a second interface to control a diagonal term for at least one qubit in the first plurality of superconducting flux qubits; and
  a third interface to control a coupling value for at least one coupler in the fifth plurality of couplers.

* * * * *